(12) United States Patent
Matsuo et al.

(10) Patent No.: US 6,737,716 B1
(45) Date of Patent: May 18, 2004

(54) SEMICONDUCTOR DEVICE AND METHOD OF MANUFACTURING THE SAME

(75) Inventors: Kouji Matsuo, Yokohama (JP); Tomohiro Saito, Yokohama (JP); Kyoichi Suguro, Yokohama (JP); Shinichi Nakamura, Yokohama (JP)

(73) Assignee: Kabushiki Kaisha Toshiba, Kawashi (JP)

( * ) Notice: Subject to any disclaimer, the term of this patent is extended or adjusted under 35 U.S.C. 154(b) by 0 days.

(21) Appl. No.: 09/492,780

(22) Filed: Jan. 28, 2000

(30) Foreign Application Priority Data

Jan. 29, 1999 (JP) .......................................... 11-022688
Feb. 19, 1999 (JP) .......................................... 11-041343
Sep. 21, 1999 (JP) .......................................... 11-267207

(51) Int. Cl.$^7$ .................. H01L 29/76; H01L 31/062; H01L 23/48; H01L 29/12
(52) U.S. Cl. .................. 257/406; 257/412; 257/413; 257/754; 257/755; 257/915
(58) Field of Search ................. 257/406, 412, 257/413, 754, 755, 915

(56) References Cited

U.S. PATENT DOCUMENTS

| 5,747,361 A | * | 5/1998 | Ouellet ........................ 437/190 |
| 5,801,427 A | * | 9/1998 | Shiratake et al. ............ 257/412 |
| 5,907,188 A | * | 5/1999 | Nakajima et al. ............ 257/751 |
| 5,936,306 A | * | 8/1999 | Jeng ............................ 257/751 |
| 5,962,904 A | * | 10/1999 | Hu .............................. 257/412 |
| 6,091,120 A | * | 7/2000 | Yeom et al. ................. 257/401 |
| 6,147,388 A | * | 11/2000 | Ma et al. ..................... 257/412 |
| 6,162,715 A | * | 12/2000 | Mak et al. ................... 438/592 |
| 6,208,004 B1 | * | 3/2001 | Ciunningham ............... 257/413 |
| 6,236,093 B1 | * | 5/2001 | Hiura .......................... 257/413 |
| 6,284,635 B1 | * | 9/2001 | Jang ............................ 438/592 |

FOREIGN PATENT DOCUMENTS

DE          29 40 200 A1   *  3/1981

OTHER PUBLICATIONS

Wittner, M. et al. "Oxidation Kinetics of TiN Films", J. Appl. Phys., vol. 52, pp. 6659–6664, Nov. (1981).
Matsuo, K. et al., "Reliable High–k $TiO_2$ Gate Insulator Formed by Ultrathin TiN Deposition and Low Temperature Oxidation", Extended Abstracts of the 1999 International Conference on Solid State Devices and Materials pp. 164–165, (1999).

* cited by examiner

*Primary Examiner*—Long Pham
*Assistant Examiner*—Shrinivas H. Rao
(74) *Attorney, Agent, or Firm*—Finnegan, Henderson, Farabow, Garrett & Dunner, L.L.P.

(57) ABSTRACT

Disclosed is a method of manufacturing a semiconductor device, comprising forming a metal compound film directly or indirectly on a semiconductor substrate, forming a metal-containing insulating film consisting of a metal oxide film or a metal silicate film by oxidizing the metal compound film, and forming an electrode on the metal-containing insulating film.

7 Claims, 25 Drawing Sheets

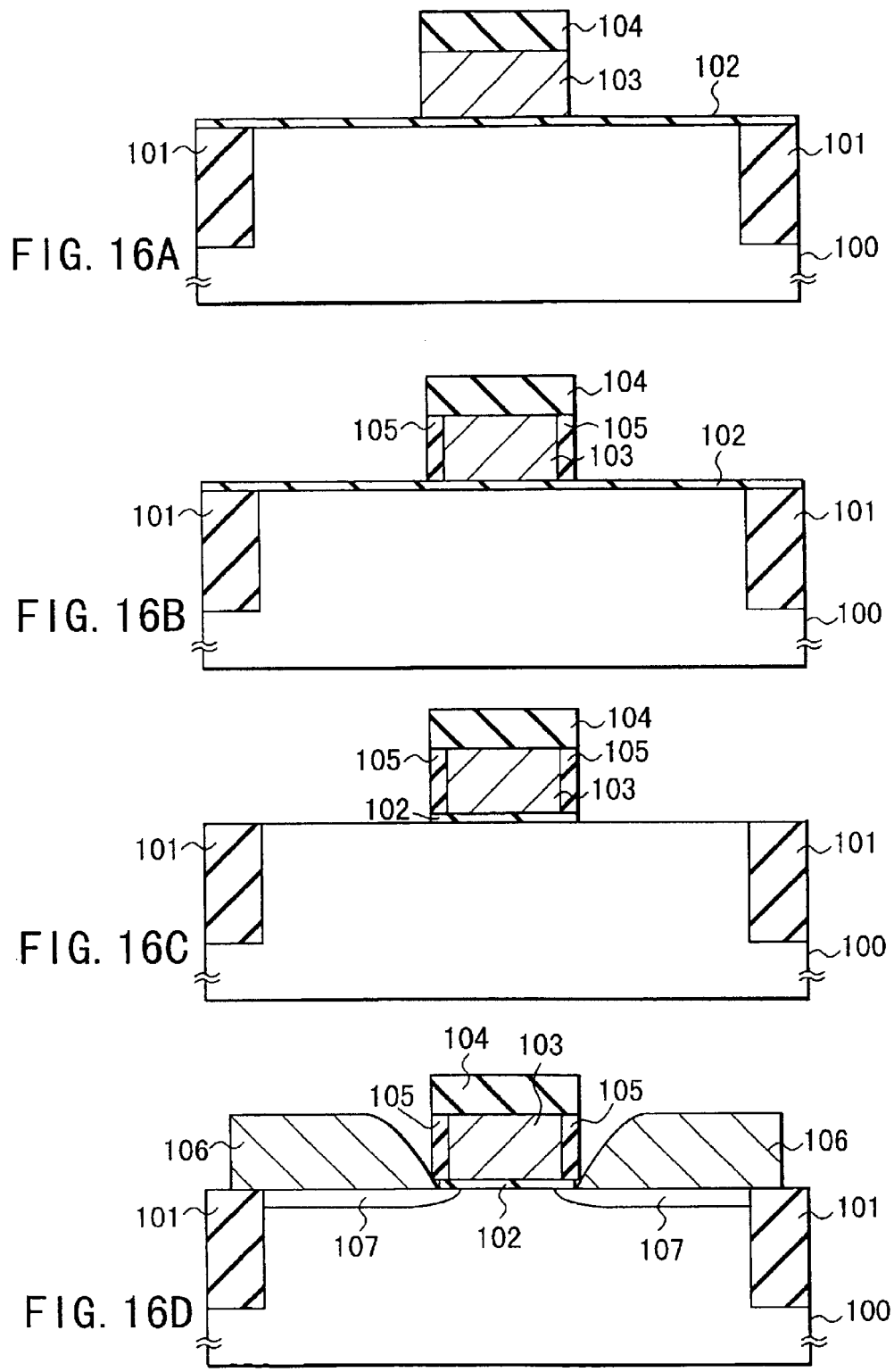

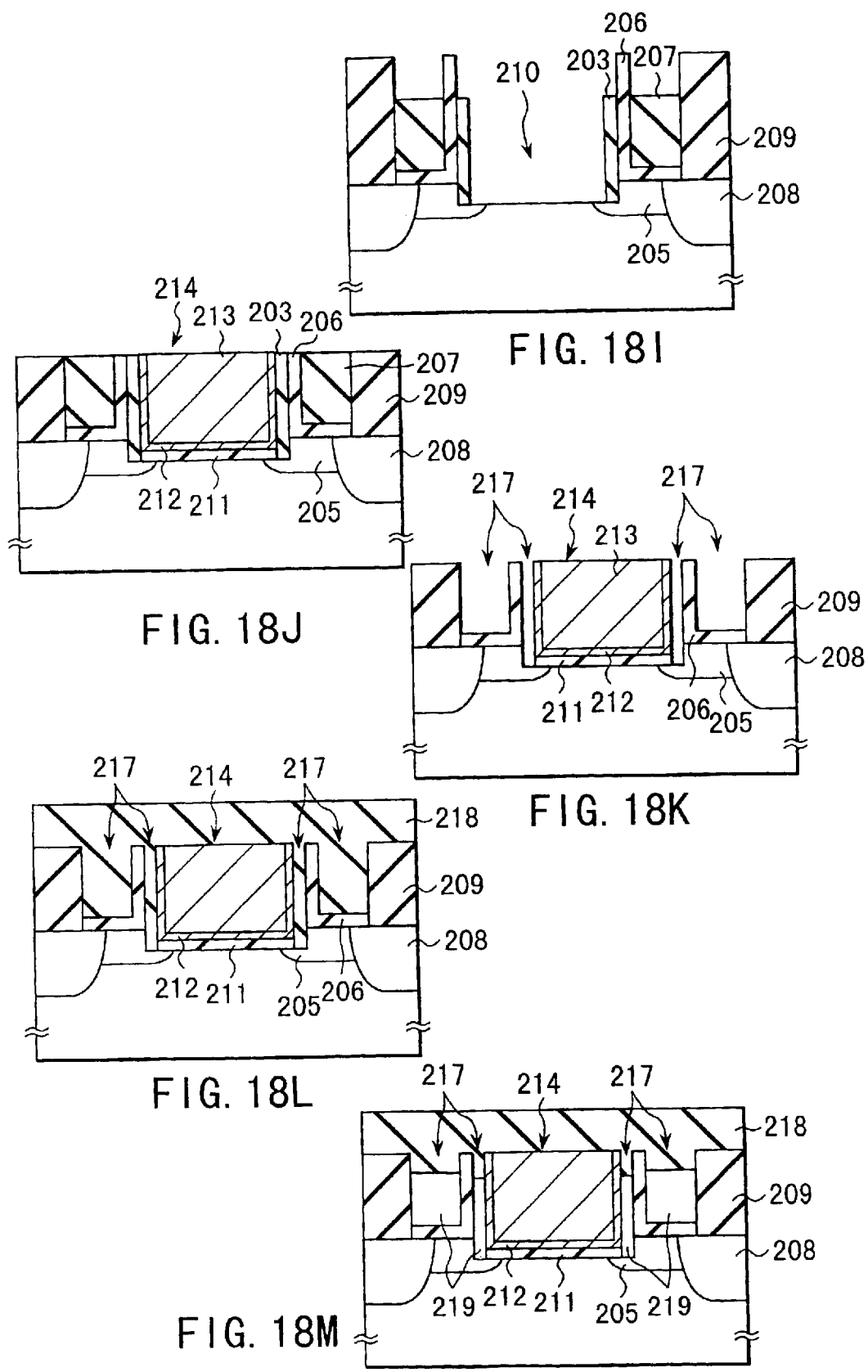

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Applications No. 11-022688, filed Jan. 29, 1999; No. 11-041343, filed Feb. 19, 1999; and No. 11-267207, filed Sep. 21, 1999, the entire contents of which are incorporated herein by reference.

BACKGROUND OF THE INVENTION

The present invention relates to a semiconductor device and a method of manufacturing the same, particularly, to improvement in performance of the gate insulating film.

With progress in miniaturization of a MOSFET, the gate electrode is required to have a lower resistance. Also, in a gate electrode using a polycrystalline silicon (polysilicon), the problem of depletion is not negligible nowadays. Therefore, it is of high importance to develop a gate structure consisting of a metal single layer. Concerning the gate insulating film, it is proposed to use a film made of a material having a high dielectric constant, e.g., $TiO_2$, in place of $SiO_2$ for decreasing the equivalent oxide thickness of the gate insulating film.

FIGS. 14A to 14C show a conventional manufacturing process. In the first step, a $TiO_2$ film 502 is formed as a gate insulating film by a LP-CVD method in a thickness of about 10 nm on a silicon substrate 500, as shown in FIG. 14A. Used as the CVD gas is, for example, $Ti(C_{11}H_{19}O_2)_2Cl_2$. Then, a TiN film 503 in a thickness of 10 to 20 nm is formed on the $TiO_2$ film 502 by a CVD method under a gaseous atmosphere of $TiCl_4$ and $NH_3$ as shown in FIG. 14B. The TiN film 503 acts as a barrier metal layer serving to prevent diffusion of a gate electrode material into the gate insulating film or to control the work function. Further, a metal electrode 504 consisting of W, Al, Cu, etc. is formed by CVD on the TiN film 503, as shown in FIG. 14C.

However, the conventional method described above gives rise to a serious problem. Specifically, it is difficult to form the $TiO_2$ film 502 having oxygen supplied thereinto completely in the step shown in FIG. 14A. Since the oxygen shortage functions as a donor in the $TiO_2$ film 502, the insulating properties of the $TiO_2$ film are markedly deteriorated by a slight oxygen shortage. It should also be noted that the impurities contained in the CVD gas such as carbon and chlorine are left unremoved so as to cause the oxygen shortage. Further, the CVD film tends to become lower in density than the oxide film formed by thermal oxidation, as can be seen from CVD of a silicon oxide film. As a result, an oxygen shortage tends to be caused. Such being the situation, it is difficult to form a transistor having good characteristics and a high reliability.

On the other hand, the $TiO_2$ film 502 constituting the conventional gate insulating film leaves room for further improvement in the film structure. FIGS. 15A and 15B schematically show the film structure of the $TiO_2$ film 502, wherein FIG. 15A is a cross sectional view, and FIG. 15B is a plan view.

In forming the $TiO_2$ film 502 in the step shown in FIG. 14A, a clear crystal grain boundary 512 is formed between adjacent crystal grains 511 of $TiO_2$, as shown in FIGS. 15A and 15B. As a result, the electrical insulating properties of the $TiO_2$ film constituting the gate insulating film are markedly deteriorated, making it very difficult to prepare a MIS transistor having good characteristics and a high reliability.

BRIEF SUMMARY OF THE INVENTION

An object of the present invention is to provide a semiconductor device in which insulating properties of the insulating film such as a gate insulating film are improved so as to improve the characteristics and reliability of the semiconductor device and a method of manufacturing the particular semiconductor device.

According to a first aspect of the present invention, there is provided a method of manufacturing a semiconductor device, comprising:

forming a metal compound film directly or indirectly on a semiconductor substrate;

forming a metal-containing insulating film consisting of a metal oxide film or a metal silicate film by oxidizing the metal compound film; and forming an electrode on the metal-containing insulating film.

In the first aspect of the present invention, the metal-containing insulating film may consist of a plurality of first insulating regions formed of grains containing a metal oxide of a metal element constituting the metal compound film and a second insulating region formed of an amorphous insulating material in a region except the first insulating regions.

According to a second aspect of the present invention, there is provided a semiconductor device, comprising:

a semiconductor substrate;

a metal-containing insulating film formed directly or indirectly on the semiconductor substrate, the metal-containing insulating film consisting of a plurality of first insulating regions formed of grains containing a metal oxide and a second insulating region formed of an amorphous insulating material in a region except the first insulating regions; and an electrode formed on the metal-containing insulating film.

According to a third aspect of the present invention, there is provided a semiconductor device, comprising:

a first metal oxide film formed directly or indirectly on a semiconductor substrate;

a second metal oxide film formed on the first metal oxide film; and a gate electrode formed on the second metal oxide film, wherein, the decrease of the Gibbs free energy at the time when a metal constituting the gate electrode forms an oxide is larger than that at the time when a metal constituting the first metal oxide film forms an oxide, and the decrease of the Gibbs free energy at the time when a metal constituting the second metal oxide film forms an oxide is larger than or equal to that at the time when the metal constituting the gate electrode forms an oxide.

According to a fourth aspect of the present invention, there is provided a semiconductor device, comprising:

a semiconductor substrate having a trench;

a metal-containing insulating film consisting of a metal oxide film or a metal silicate film and formed along the inner surface of the trench, the metal-containing insulating film constituting a gate insulating film; and a gate electrode formed on the metal-containing insulating film, wherein a thickness A of the metal-containing insulating film in the center of the bottom portion, a thickness B of the metal-containing insulating film in the center of the side wall portion, and a thickness C of the metal-containing insulating film at the corner portion along a line joining the intersection between the bottom portion and the side wall portion of the trench and the intersection between the upper surface and the side wall surface of the metal-containing insulating film meet the relationship $C^2>(A^2+B^2)$.

According to a fifth aspect of the present invention, there is provided a semiconductor device, comprising:

a semiconductor substrate;

a gate insulating film formed on the semiconductor substrate;

a gate electrode formed on the gate insulating film;

a side wall insulating film formed along a side wall of the gate electrode;

a metal oxide film formed on the upper surface of the gate electrode;

diffusion layers formed within those portions of the semiconductor substrate which are positioned on both sides of the gate electrode;

source-drain regions formed on the diffusion layers and in contact with the side wall insulating film; and silicide films formed on the source-drain regions, the upper surface of the silicide film being substantially flush with the upper surface of the metal oxide film.

In the fifth aspect of the present invention, the silicide film contains a noble metal forming a silicide at a temperature lower than the melting point of aluminum. The silicide film contains at least one of palladium, nickel, platinum and cobalt. Also, the gate electrode consists of aluminum, titanium, zirconium, hafnium, tantalum, niobium, vanadium or a nitride of any of these metals.

The present invention also provides semiconductor devices A and B given below and methods C to H of manufacturing a semiconductor device given below:

A. A semiconductor device, comprising:

a gate insulating film formed on a semiconductor substrate;

a gate electrode formed on the gate insulating film;

a side wall insulating film formed along the side wall of the gate electrode;

source-drain regions formed on those portions of the semiconductor substrate which are positioned on both sides of the gate electrode and do not have a contaminated layer, the source-drain regions having a facet, and the upper surfaces of the source-drain regions being positioned higher than the upper surface of the semiconductor substrate;

diffusion layers formed within the semiconductor substrate and positioned below the source-drain regions; and silicide films formed on the source-drain regions.

B. A semiconductor device, comprising:

a gate insulating film formed on a semiconductor substrate;

a gate electrode formed on the gate insulating film;

a side wall region formed along the side wall of the gate electrode, the side wall region consisting of a plurality of insulating regions differing from each other in dielectric constant; and source-drain regions formed on those portions of the semiconductor substrate which are positioned on both sides of the gate electrode, the upper surfaces of the source-drain regions being positioned higher than the upper surface of the semiconductor substrate.

In semiconductor device B of the present invention, at least one of the plural insulating regions constituting the side wall region is formed of the air.

C. A method of manufacturing a semiconductor device, comprising:

forming a first insulating film on a semiconductor substrate;

forming a gate electrode on the first insulating film;

selectively forming a second insulating film on the upper surface of the gate electrode;

forming a third insulating film on the side wall of the gate electrode;

applying a treatment with phosphoric acid so as to selectively remove that portion of the first insulating film which is positioned outside the gate electrode and the third insulating film so as to expose the surface of the semiconductor substrate;

forming an epitaxial layer having a facet on the exposed portion of the semiconductor substrate;

injecting an impurity into the epitaxial layer to form a first diffusion layer; and diffusing the impurity within the first diffusion layer to form a second diffusion layer in a surface region of the semiconductor substrate.

In the manufacturing method C of the present, invention, the treatment with phosphoric acid should be carried out at a temperature falling within a range of between room temperature and 180° C. Preferably, the phosphoric acid treatment should be carried out at 160° C.

D. A method of manufacturing a semiconductor device, comprising:

forming a first insulating film on a semiconductor substrate;

forming a dummy gate on the first insulating film;

forming a second insulating film on the side surface of the dummy gate;

applying a treatment with phosphoric acid to selectively remove that portion of the first insulating film which is positioned outside the dummy gate and the second insulating film so as to expose the surface of the semiconductor substrate;

forming an epitaxial layer having a facet on the exposed semiconductor substrate;

implanting impurity ions into the epitaxial layer to form a first diffusion layer;

diffusing the impurity within the first diffusion layer to form a second diffusion layer in a surface region of the semiconductor substrate;

forming a silicide film on the first diffusion layer;

forming an interlayer insulating film;

flattening the interlayer insulating film to expose the surface of the dummy gate;

removing the dummy gate and the first insulating film to form an opening;

forming a gate insulating film within the opening;

forming a reaction preventing film on the gate insulating film;

forming a metal film on the reaction preventing film; and flattening the gate insulating film, the reaction preventing film and the metal film to expose the surface of the interlayer insulating film.

In the manufacturing method D of the present invention, the gate insulating film consists of a tantalum oxide film, the reaction preventing film consists of a titanium nitride film, and the metal film consists of an aluminum film.

E. A method of manufacturing a semiconductor device, comprising:

forming a dummy gate on a semiconductor substrate;

forming a first side wall insulating film on the side wall of the dummy gate;

forming an epitaxial layer on the exposed surface of the semiconductor substrate;

injecting an impurity into the epitaxial layer to form a first diffusion layer;

forming a second side wall insulating film on the side surface of the first side wall insulating film;

forming a third side wall insulating film on the side surface of the second side wall insulating film;

injecting an impurity into the semiconductor substrate to form a second diffusion layer;

forming a first interlayer insulating film;

flattening the first interlayer insulating film to expose the surface of the dummy gate;

removing the dummy gate to form a first trench;

forming a gate insulating film within the first trench; and forming a gate electrode on the gate insulating film.

The manufacturing method E of the present invention further comprises removing the first and third side wall insulating films to form second and third trenches after formation of the gate electrode and subsequently forming a second interlayer insulating film.

F. A method of manufacturing a semiconductor device, comprising:

forming a dummy gate on a semiconductor substrate;

forming a first side wall insulating film on the side wall of the dummy gate;

forming a first epitaxial layer in contact with the first side wall insulating film on the exposed surface of the semiconductor substrate;

injecting an impurity into the first epitaxial layer to form a first diffusion layer;

forming a second side wall insulating film on the side surface of the first side wall insulating film;

forming a third side wall insulating film on the side surface of the second side wall insulating film;

forming a second epitaxial layer on the first diffusion layer;

injecting an impurity into the second epitaxial layer to form a second diffusion layer;

forming a first interlayer insulating film;

flattening the first interlayer insulating film to expose the surface of the dummy gate;

removing the dummy gate to form a first trench;

forming a gate insulating film within the first trench;

forming a gate electrode on the gate insulating film;

removing the first and third side wall insulating films to form second and third trenches, respectively; and forming a second interlayer insulating film.

In the manufacturing method F of the present invention, the second interlayer insulating film may be formed to fill the second and third trenches or to form free spaces within the second and third trenches.

G. A method of manufacturing a semiconductor device, comprising:

forming a gate insulating film on a semiconductor substrate;

forming a gate electrode on the gate insulating film;

forming a first side wall insulating film on the side surface of the gate electrode;

forming an epitaxial layer on the exposed surface of the semiconductor substrate;

injecting an impurity into the epitaxial layer to form a first diffusion layer;

forming a second side wall insulating film on the side surface of the first side wall insulating film;

forming a third side wall insulating film on the side surface of the second side wall insulating film; and injecting an impurity into the semiconductor substrate to form a second diffusion layer.

H. A method of manufacturing a semiconductor device, comprising:

forming a insulating film on a entire surface of a semiconductor substrate provided with source-drain regions;

flattening the insulating film to expose the surface of the source-drain regions; and selectively converting the surface region of the exposed portion of the source-drain regions into a silicide film.

In the manufacturing method H of the present invention, upper portions of the source-drain regions may be formed of an epitaxial layer.

In the manufacturing method H of the present invention, formation of the silicide film may include the steps of, forming a first metal film on a entire surface of the substrate after exposing the surface of the source-drain regions, applying a heat treatment to cause reaction between the source-drain regions and the first metal film, and removing the unreacted first metal film. It is possible for the unreacted first metal film to be removed by a CMP method.

In the manufacturing method H of the present invention, further comprises oxidizing an upper surface of a gate electrode formed of a second metal film different from the first metal film, before forming the silicide film.

In the manufacturing method H of the present invention, the first metal film is formed of a noble metal forming a silicide at a temperature lower than the melting point of aluminum. The first metal film includes palladium, nickel, platinum and cobalt. Also, the first metal film may be formed of an alloy containing at least one of these metals. Further, the second metal film is formed of aluminum, titanium, zirconium, hafnium, tantalum, niobium, vanadium or a nitride of any of these metals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 16A to 16D are cross sectional views showing a method of manufacturing a semiconductor device according to embodiment 3(A) of the present invention;

FIGS. 18A to 18M are cross sectional views showing a method of manufacturing a semiconductor device according to embodiment 4(A) of the present invention;

FIGS. 22A to 20F are cross sectional views showing a method of manufacturing a semiconductor device according to embodiment 4(B) of the present invention;

DETAILED DESCRIPTION OF THE INVENTION

Embodiment 1 of the present invention will now be described with reference to the accompanying drawings.

Embodiment 1(A)

Figure 1A:
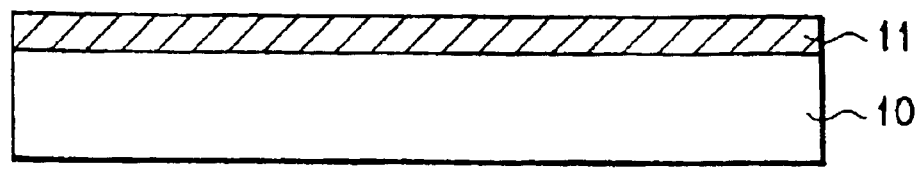
FIGS. 1A to 1C are cross sectional views showing a method of manufacturing a semiconductor device according to embodiment 1(A) of the present invention.
Figure 1B:
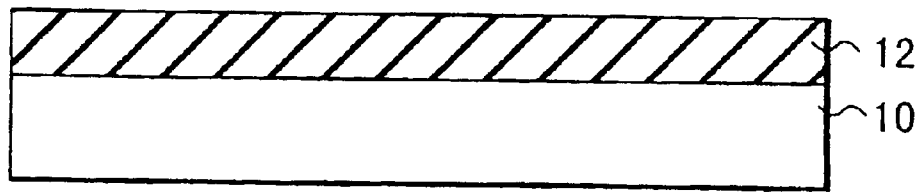
Figure 1C:
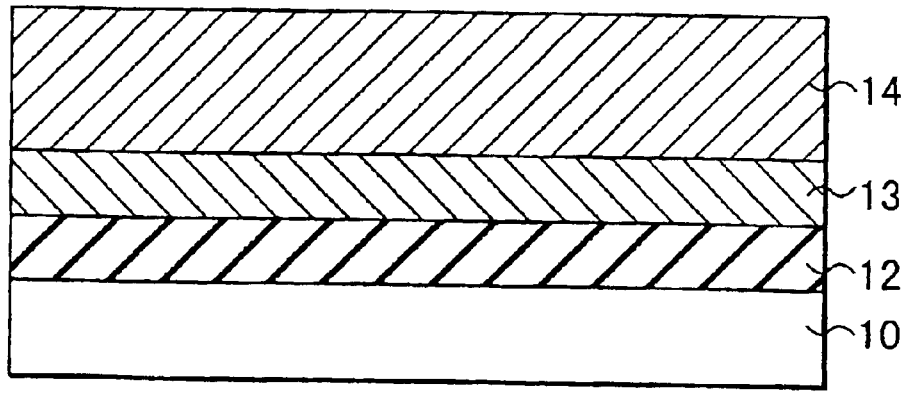

FIGS. 1A to 1C are cross sectional views showing a method of manufacturing a semiconductor device according to embodiment 1(A) of the present invention. In the first step, a thin TiN film 11 having a thickness of about 2 nm is formed on a silicon substrate 10, as shown in FIG. 1A. The TiN film 11 is formed by a CVD method under a mixed gas atmosphere containing $TiCl_4$ and $NH_3$. In addition to the $TiCl_4/NH_3$ mixed gas, $TiI_4/NH_3$ mixed gas and $TiBr_4/NH_3$ mixed gas can also be used. Further, the following mixed gases can also be used in the present invention:

$(C_5H_5)(C_8H_8)Ti/NH_3$ mixed gas;
$(C_5H_5)_2Ti[N(CH_3)_2]_2/NH_3$ mixed gas;
$(C_5H_5)_2TiCl_2/NH_3$ mixed gas;
$[(CH_3)_3SiCH_2]_4Ti/NH_3$ mixed gas;
$Ti[N(CH_3)_2]_4$ series gas;
$Ti[N(C_2H_5)_2]_4$ series gas;
$(C_5H_5)_2Ti(N_3)_2$ series gas.

In the case of using the last three gases, a TiN film can be formed without using a nitriding agent such as $NH_3$ or N radical, though it is possible to use a nitriding agent in forming a TiN film. It is also possible to form the TiN film by a sputtering method using a Ti target or a Ti target containing N. In this case, used is a plasma of a mixed gas containing Ar, Kr or Xe gas and a N-containing gas such as $N_2$ gas. Further, the TiN film can be formed by a vacuum vapor deposition method. Where a sputtering method is employed, the energy of the ions such as Ar ions for sputtering the target and the energy of the particles liberated from the target should be not higher than 100 eV, preferably not higher than 50 eV, and more preferably not higher than 20 eV. In this case, the damage done to the film surface can be diminished to form a gate insulating film having a higher reliability.

In the next step, the TiN film 11 is oxidized by a heat treatment under an $O_2$ atmosphere, an $O_3$ atmosphere, an oxygen radical atmosphere or a steam atmosphere to form a $TiO_2$ film 12 having a thickness of about 4 nm, as shown in FIG. 1B. It is possible to apply the oxidizing treatment excessively to form a silicon oxide film at the boundary between the silicon substrate 10 and the $TiO_2$ film 12.

Where a thicker $TiO_2$ film (about 20 nm thick) is required, it is possible to oxidize a TiN film having a thickness of about 10 nm to form a $TiO_2$ film having a thickness of about 20 nm. However, the present inventors have found through experiments that the decrease in the thickness of the TiN film facilitates out-diffusion of nitrogen generated during the oxidizing treatment or chlorine or carbon mixed in the TiN film during the film formation. In other words, it has been found that a high quality $TiO_2$ film free from impurities and oxygen shortage can be obtained if the thickness of the TiN film is decreased. It has also been found that, with increase in the thickness of the $TiO_2$ film, large crystal grains tend to exist in the $TiO_2$ film so as to deteriorate the surface morphology.

Where it is desired to form a thick $TiO_2$ film, a high quality $TiO_2$ film can be obtained by repeating the process of forming a TiN film having a thickness of about 2 nm and the process of oxidizing the TiN film. For example, a $TiO_2$ having a thickness of about 20 nm can be obtained by repeating 5 times the process of forming a TiN film about 2 nm thick and the oxidizing process.

The impurity content can be lowered by increasing the oxidizing temperature. However, the crystal grain diameter of the $TiO_2$ film is enlarged with increase in the oxidizing temperature. The increase in the crystal grain diameter deteriorates the surface morphology. Such being the situation, it is desirable to carry out the oxidizing treatment at a temperature not higher than 500° C. The impurity content of the formed film is certainly increased if the oxidizing temperature is lowered. However, the impurities can be out-diffused by setting the thickness of the TiN film at 5 nm or less, preferably at 2 nm or less.

Then, a TiN film 13 acting as a barrier metal layer is formed by a CVD method, followed by forming a desired metal layer as a gate electrode 14, as shown in FIG. 1C.

This embodiment is featured in that the TiN film 11 is formed and, then, oxidized to form the $TiO_2$ film 12. Unlike the conventional $TiO_2$ film formed directly by a CVD method, the $TiO_2$ film is formed by thermal oxidation in this embodiment of the present invention. As a result, the $TiO_2$ film free from oxygen deficiency and having a high reliability can be obtained. Further, by setting the thickness of the TiN film at 5 nm or less, preferably 2 nm or less, the impurities generated during the oxidizing process such as nitrogen, carbon and chlorine can be out-diffused easily.

Incidentally, it is already reported that an $Al_2O_3$ layer is formed by thermal oxidation of an Al layer. In this technique, however, Al reacts with the underlying silicon substrate or a silicon oxide film during the thermal oxidation of the Al layer. In the present invention, however, silicon is not diffused into the TiN film, and the TiN film does not react with the underlying silicon substrate, making it possible to form a $TiO_2$ film without bringing about reaction with the silicon substrate during the thermal oxidation process. It follows that it is possible to avoid problems such as an increased roughness of the boundary between the gate insulating film and the silicon substrate that is caused by the silicide reaction with the silicon substrate.

In oxidizing the TiN film 11 in the process shown in FIG. 1B, it is possible for a silicon oxide film to be formed at the boundary between the silicon substrate 10 and the $TiO_2$ film 12 and to have an excessively large thickness, if the oxidization is performed excessively. To prevent the problem, it is desirable to form in advance a very thin silicon oxynitride film about 1 nm thick on the silicon substrate 10. The silicon oxynitride film thus formed prevents the silicon substrate 10 from being oxidized. Alternatively, it is possible to form a silicon oxide film in place of the silicon oxynitride film.

In this embodiment, the TiN film 11 is oxidized to form the $TiO_2$ film. However, the present invention is featured in that a metal compound film that does not react with the silicon substrate is formed and thermally oxidized to form a metal oxide film. Therefore, a TiC film can be used in place of the TiN film.

It is also possible to use a TiON film or a TiONC film. Since a film having small crystal grains or an amorphous film can be formed by allowing the TiN film to contain oxygen or carbon, the surface morphology is improved. Naturally, the $TiO_2$ film obtained by oxidizing the TiON film or a TiONC film exhibits an improved surface smoothness.

A mixed gas containing $TiCl_4$, $NH_3$ and $O_2$, a mixed gas containing $TiI_4$, $NH_3$ and $O_2$ and a mixed gas containing $TiBr_4$, $NH_3$ and $O_2$ can be used for forming the TiON film. For forming the TiNC film, it is possible to use an organic gas containing C including, for example, the gases given below:

$(C_5H_5)(C_8H_8)Ti/NH_3$ mixed gas;
$(C_5H_5)_2Ti[N(CH_3)_2]_2/NH_3$ mixed gas;
$(C_5H_5)_2TiCl_2/NH_3$ mixed gas;
$[(CH_3)_3SiCH_2]_4Ti/NH_3$ mixed gas;
$Ti[N(CH_3)_2]_4$ series gas;
$Ti[N(C_2H_5)_2]_4$ series gas;
$(C_2H_5)_2Ti(N_3)_2$ series gas.

For forming the TiONC film, it is possible to use the above organic gas by adding oxygen gas.

It is also possible to employ a sputtering method using a Ti target or a Ti target containing O, N or C. In this case, used is a plasma of a mixed gas containing Ar, Kr or Xe gas and O or N. Where a sputtering method is employed, the energy of the ions such as Ar ions for sputtering the target and the energy of the particles liberated from the target should be not higher than 100 eV, preferably not higher than 50 eV, and more preferably not higher than 20 eV. In this case, the damage done to the film surface can be diminished to form a gate insulating film having a higher reliability.

It is also possible to form the $TiO_2$ film by oxidizing an oxygen deficient $TiO_{2-x}$ film. In this case, the effect described previously can also be obtained because the $TiO_2$ film is formed by thermal oxidation. The CVD gas source used for forming the TiO film or $TiO_{2-x}$ film includes, for example:

$Ti(C_{11}H_{19}O_2)Cl_2$ series gas;
$Ti(OC_2H_5)_4$ series gas;
$Ti(i-OC_3H_7)_4$ series gas;
$Ti(OCH_3)_4$ series gas; and
$Ti(n-OC_4H_9)_4$ series gas.

The $TiO_{2-x}$ film can be formed under temperatures falling within a range of between 400° C. and 750° C. It should be noted that the above CVD gas sources can be used by adding $NH_3$ gas for forming the TiONC film, A $TiO_2$ film was formed in this embodiment. However, a merit similar to that in this embodiment can be obtained in the case of using a metal nitride film that does not react with the underlying silicon substrate like the TiN film. For example, a ZrN film, a HfN film, a TaN film or a NbN film can be used in place of the TiN film, and such a metal nitride film can be oxidized to form a $ZrO_2$ film, a $HfO_2$ film, a $Ta_2O_5$ film or a $Nb_2O_5$ film. In the case of using the $ZrO_2$ film, $HfO_2$ film, $Ta_2O_5$ film or $Nb_2O_5$ film as a gate insulating film, additional merits can be obtained as summarized below:

$ZrO_2$ film: The gate electrode can be formed of not only TiN but also ZrN that does not react with the gate insulating film made of $ZrO_2$. ZrN has a work function smaller than that of TiN. Thus, if a ZrN gate electrode is used in an n-type MOSFET requiring a low threshold voltage Vth, the threshold voltage Vth can be further lowered, compared with the n-type MOSFET using a TiN gate electrode. Further, the band gap for $ZrO_2$ is 8 eV in contrast to 3 eV for $TiO_2$. Therefore, a thin film exhibiting good insulating properties can be obtained.

$HfO_2$ film: The gate electrode can be formed of not only TiN and ZrN but also HfN that does not react with the gate insulating film made of $HfO_2$. HfN has a work function smaller than that of TiN or ZrN. Thus, if a HfN gate electrode is used in an n-type MOSFET requiring a low threshold voltage Vth, the threshold voltage Vth can be further lowered, compared with the n-type MOSFET using a TiN or ZrN gate electrode. Further, the band gap for $HfO_2$ is 8 eV, which is equal to that for $ZrO_2$. Therefore, a thin film exhibiting good insulating properties can be obtained.

$Ta_2O_5$ film: A $Ta_2O_5$ film is a film having a high dielectric constant, which is being studied most vigorously nowadays. It is possible for the $Ta_2O_5$ film to lower the expenses for the development, compared with the other metal oxide films noted above.

$Nb_2O_5$ film: The properties of a $Nb_2O_5$ film are substantially equal to those of the $Ta_2O_5$ film. Thus, the technology for the $Ta_2O_5$ film can be employed as it is for the $Nb_2O_5$ film.

It is also possible to use aluminum, yttrium and cerium in addition to titanium, zirconium, hafnium, tantalum and niobium noted above. Further, these metals can be used in combination. Particularly, yttrium can be used in combination with zirconium to form an insulating film called YSZ (Yttrium Stabilized Zirconia).

In this embodiment of the present invention, a metal compound film such as TiN film is thermally oxidized to form a metal oxide film such as a $TiO_2$ film. Alternatively, it is also possible to allow a metal compound film such as a TiN film to contain silicon and to thermally oxidize the silicon-containing metal compound film to form a metal silicate film. In this case, it is possible to use various metal compounds and metal oxides described previously. Also, the metal silicate film can be formed by a method similar to that described in this embodiment of the present invention.

The metal silicate film includes a mode in which the metal oxide and the silicon oxide form separate phases and are present together in the form of a mixture and another mode in which metal such as Ti, silicon, and oxygen are present uniformly in the form of a compound such as $TiSiO_4$. A metal silicate film of any of these modes can be obtained by setting appropriately the oxidizing condition, the composition, the thickness, etc. of the metal compound film containing silicon.

Embodiment 1(B)

In this embodiment, a metal oxide film capable of a chemical reaction with an electrode does not react with the electrode.

FIGS. 2A to 2E are cross sectional views showing a method of manufacturing a semiconductor device according to this embodiment of the present invention.

Figure 2A:
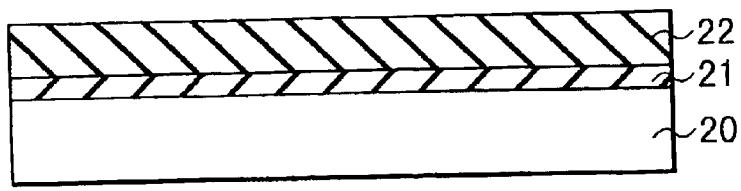
FIGS. 2A to 2E are cross sectional views showing a method of manufacturing a semiconductor device according to embodiment 1(B) of the present invention.

In the first step, a very thin silicon oxide film 21 about 1 nm thick is formed on a silicon substrate 20 by thermally oxidizing the silicon substrate 20, followed by forming a $Ta_2O_5$ film 22 about 10 nm thick on the silicon oxide film 21, as shown in FIG. 2A. The $Ta_2O_5$ film 22, which is a high dielectric constant film and acting as a gate insulating film, is formed by the method described previously in conjunction with embodiment 1(A). To reiterate, a TaN film is formed first, followed by oxidizing the TaN film to form the $Ta_2O_5$ film 22. It is possible to use a silicon oxynitride film about 1 nm thick in place of the silicon oxide film 21. The silicon oxynitride film is formed under a gaseous atmosphere containing $N_2O$, NO or $NH_3$. It is also possible to form the $Ta_2O_5$ film 22 directly on the silicon substrate 20.

Figure 2B:
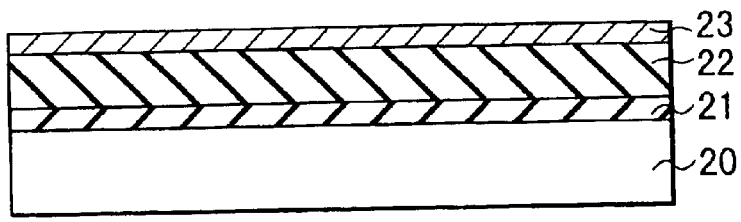
Figure 2C:
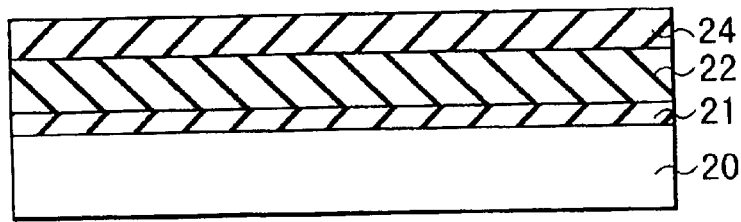
Figure 2D:
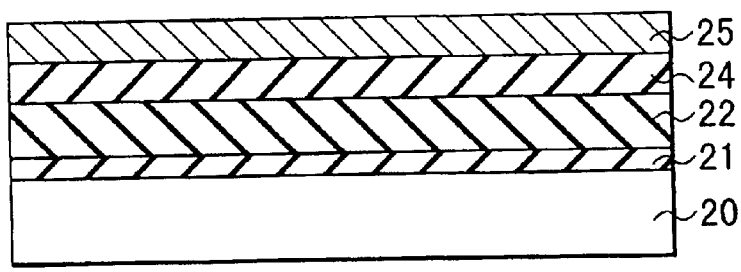
Figure 2E:
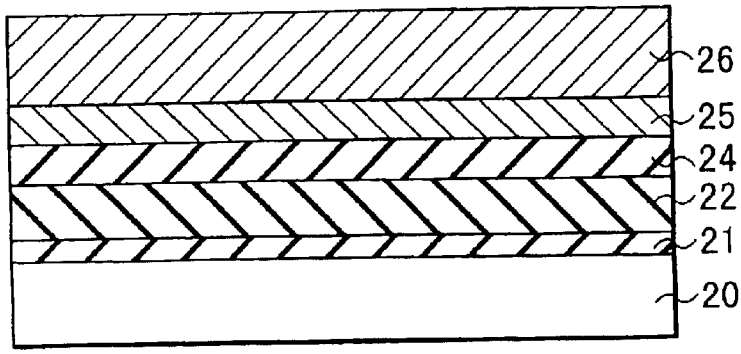

In the next step, a thin TiN film 23 about, for example, 4 nm thick is formed on the $Ta_2O_5$ film 22 by the method described previously in conjunction with embodiment 1(A), as shown in FIG. 2B, followed by oxidizing the TiN film 23 to form a $TiO_2$ 24, as shown in FIG. 2C. Then, a TiN film 25 acting as a barrier metal layer is formed on the $TiO_2$ film 24 in order to prevent the gate electrode material from being diffused into the gate insulating film or to control the work function, as shown in FIG. 2D. Further, a gate metal electrode 26 consisting of Al, W, Cu, Ag, etc. is formed by a CVD method, a sputtering method or a plating treatment, as shown in FIG. 2E.

As described above, a thin $TiO_2$ film 24 is formed on the $Ta_2O_5$ film 22, followed by forming the TiN film 25 on the $TiO_2$ film 24. The particular method permits avoiding a problem taking place where the TiN film 25 is formed directly on the $Ta_2O_5$ film 22, i.e., the problem that a reaction to form $TiO_2$ and TaN proceeds at the TiN/$Ta_2O_5$ interface, with the result that the $Ta_2O_5$ film 22 is reduced to lose the insulating properties. The reducing reaction is brought about because decrease in the Gibbs free energy at the time when Ti contained in the TiN film 25 forming the electrode forms an oxide is larger than that at the time when Ta contained in the $Ta_2O_5$ film 22 forms an oxide. In order to prevent the gate insulating film from being deteriorated by the reducing reaction, it is necessary for the decrease in the Gibbs free energy at the time when the metal forming the electrode forms an oxide to be equal to or smaller than that at the time when the metal contained in the gate insulating film forms an oxide.

In this embodiment, the thin $TiO_2$ film 24 that does not react with the electrode is interposed between the TiN film 25 constituting the electrode and the $Ta_2O_5$ film 22 acting as a gate insulating film so as to avoid the problem pointed out above. It should be noted that the metal contained in $TiO_2$ is equal to the metal contained in TiN. As a result, the decrease in Gibbs free energy at the time when the metal constituting the electrode forms an oxide is equal to that at the time when the metal contained in the uppermost layer of the gate insulating film forms an oxide, making it possible to prevent the reducing reaction of the insulating film positioned below the electrode.

Embodiment 1(C)

This embodiment is directed to a transistor using the gate structure described in conjunction with embodiments 1(A) and 1(B).

FIGS. 3A to 3F are cross sectional views showing the process of manufacturing a semiconductor device according to this embodiment of the present invention.

Figure 3A:
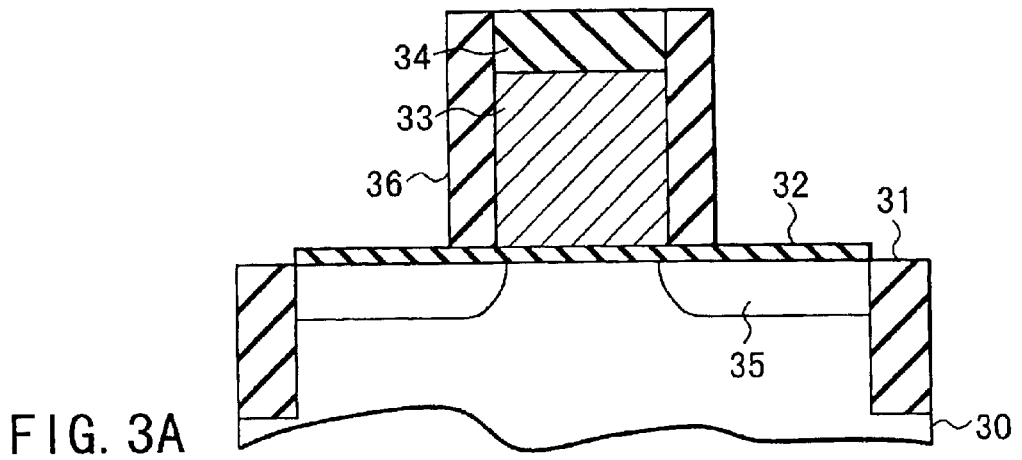
FIGS. 3A to 3F are cross sectional views showing a method of manufacturing a semiconductor device according to embodiment 1(C) of the present invention.

In the first step, an element isolating region 31 is formed by, for example, an STI technology on a silicon substrate 30, as shown in FIG. 3A. Then, a laminate structure consisting of a gate oxide film 32 about 6 nm thick, a polysilicon film 33 about 150 nm thick and a silicon nitride film 34 about 50 nm thick is formed by an oxidizing technology, a CVD technology, a lithography technology and a RIE technology. The laminate structure forms a dummy gate structure that is to be removed later. Then, an extension diffusion layer 35 is formed by ion implantation, followed by forming a gate side wall consisting of a silicon nitride film 36 having a width of about 40 nm by a CVD technology and a RIE technology.

Figure 3B:
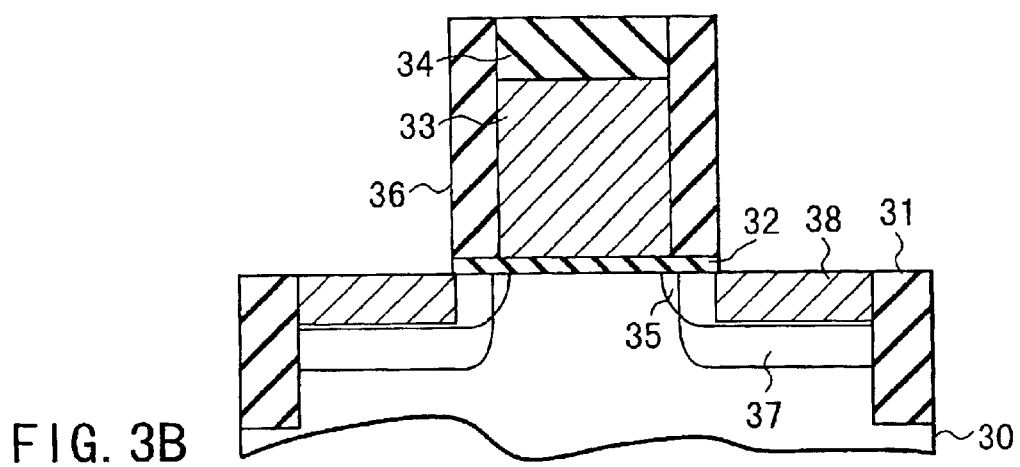
Figure 3C:
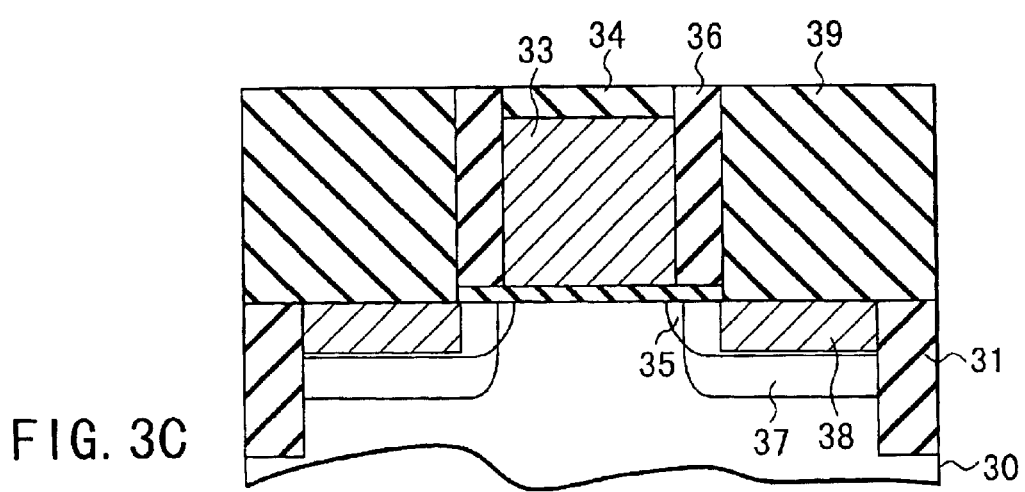

In the next step, source-drain diffusion layers 37 are formed by ion implantation, followed by forming metal silicide ($CoSi_2$ or $TiSi_2$) layers 38 each having a thickness of about 40 nm selectively within the source-drain regions by a salicide technology using the dummy gate as a mask, as shown in FIG. 3B. Then, an interlayer insulating film 39 consisting of $SiO_2$ is formed by a CVD method, followed by flattening the $SiO_2$ film 39 by a CMP technology to expose the surfaces of the silicon nitride films 34 and 36, as shown in FIG. 3C.

Figure 3D:
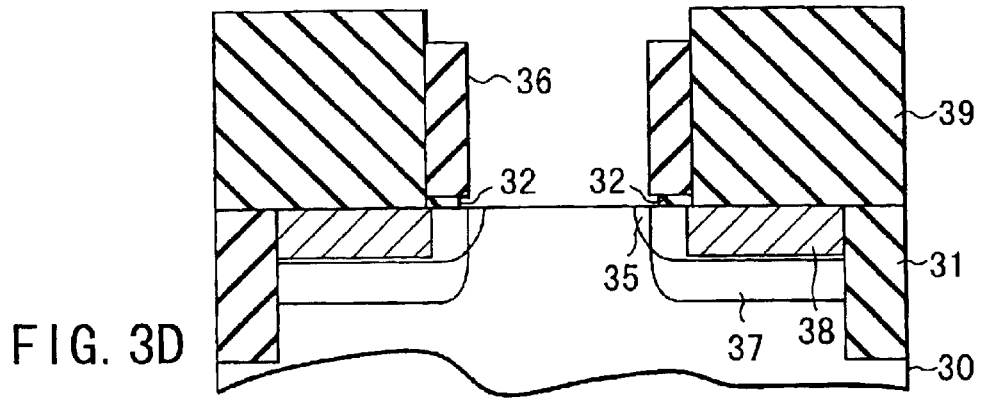

In the next step, the silicon nitride film 34 is selectively removed with, for example, phosphoric acid, with the interlayer insulating film 39 left unremoved, as shown in FIG. 3D. In this step, the silicon nitride film 36 is also etched to make the upper surface of the silicon nitride film 36 flush with the upper surface of the polysilicon film 33. Then, the polysilicon film 33 is selectively removed by a radical atom etching technology with the interlayer insulating film 39 and the silicon nitride film 36 left unremoved. Further, the dummy gate oxide film 32 is removed by a wet etching using, for example, hydrofluoric acid so as to open the gate-forming region.

Figure 3E:
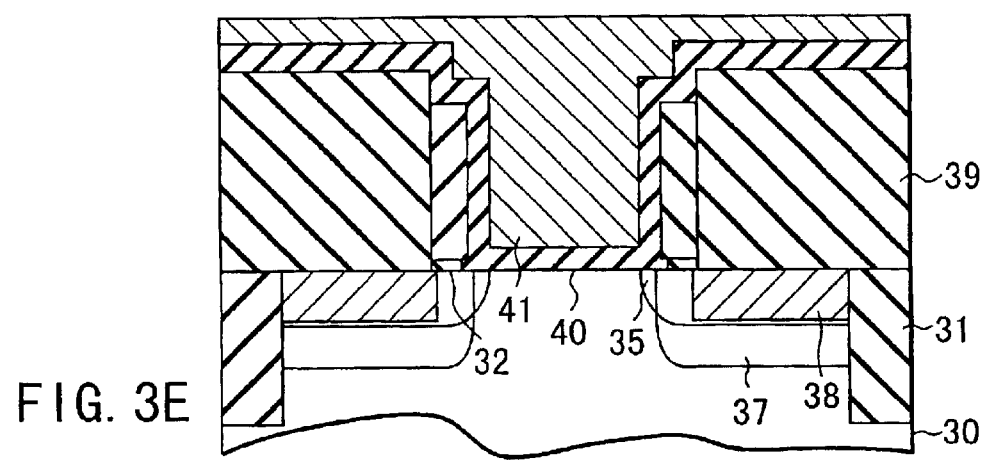
Figure 3F:
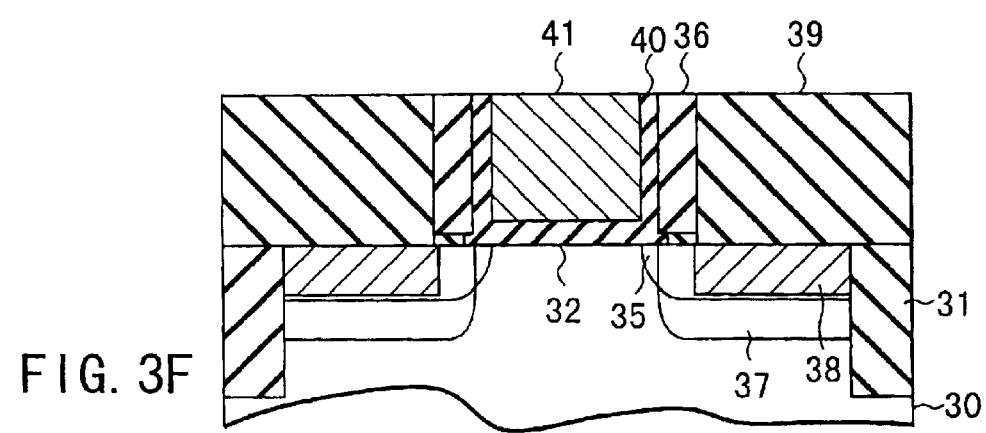

In the next step, a gate insulating film 40 consisting of a material having a high dielectric constant and a gate electrode 41 are formed by the method described previously in conjunction with embodiments 1(A) and 1(B), as shown in FIG. 3E. Finally, the gate insulating film 40 and the gate electrode 41 are flattened by a CMP technology until the interlayer insulating film 39 is exposed to the outside, as shown in FIG. 3F, so as to finish preparation of a MOSFET in which the gate insulating film 40 is formed of a material having a high dielectric constant, the gate electrode 41 is formed of a metal, and the source-drain regions are formed of a metal silicide.

A prominent merit can be obtained where the method of forming a gate insulating film described previously in conjunction with embodiments 1(A) and 1(B) is applied to the damascene gate process shown FIGS. 3A to 3F.

Figure 4A:
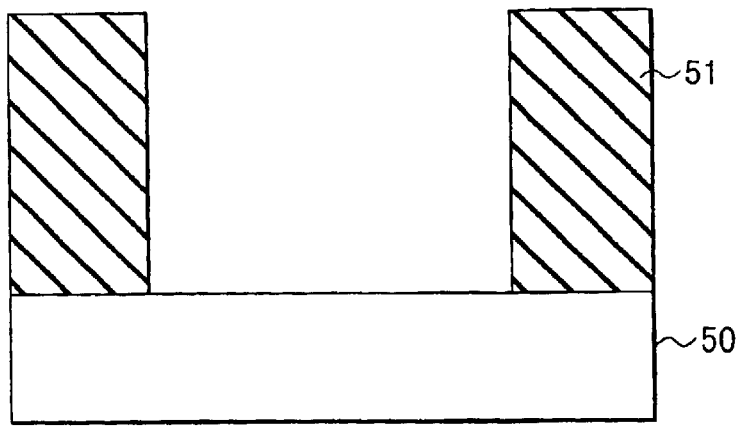
FIGS. 4A to 4E schematically show the effect produced by the method of manufacturing a semiconductor device according to embodiment 1(C) of the present invention.

FIG. 4A schematically shows a trench defined by a silicon substrate 50 forming the bottom of the trench and by an insulating film 51 forming the side surface of the trench. The structure shown in FIG. 4A corresponds to the step shown in FIG. 3D and, thus, a gate insulating film and a gate electrode are buried in the trench.

Figure 4B:
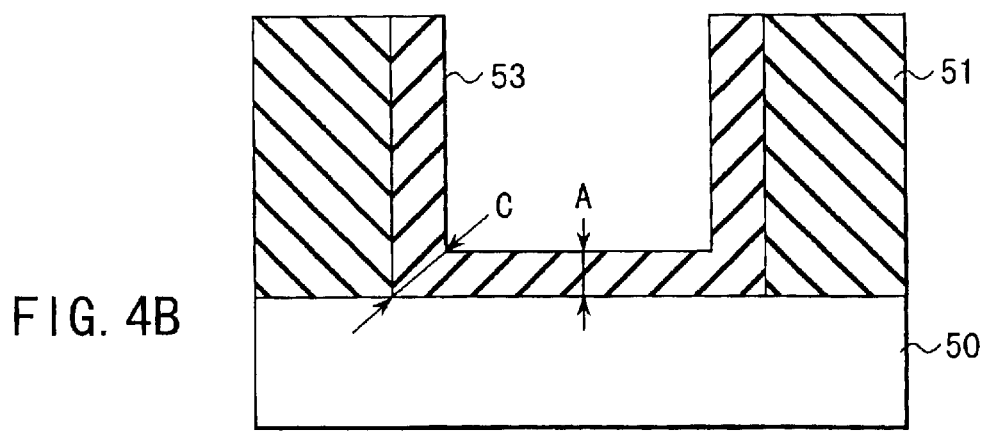

If a $TiO_2$ film is formed as a gate insulating film 53 within the trench by the conventional CVD method, the entire region of the gate insulating film 53 has a uniform thickness A as shown in FIG. 4B even in the case of employing a CVD technology that permits producing the most satisfactory coverage characteristics therefore, it is impossible for the thickness C in the corner portion to be greater than 2'½ times as much as the thickness A in the bottom portion. In the corner portion, the electric field is concentrated by the voltage applied to the gate electrode and, thus, the gate breakdown voltage tends to be unsatisfactory.

Figure 4C:
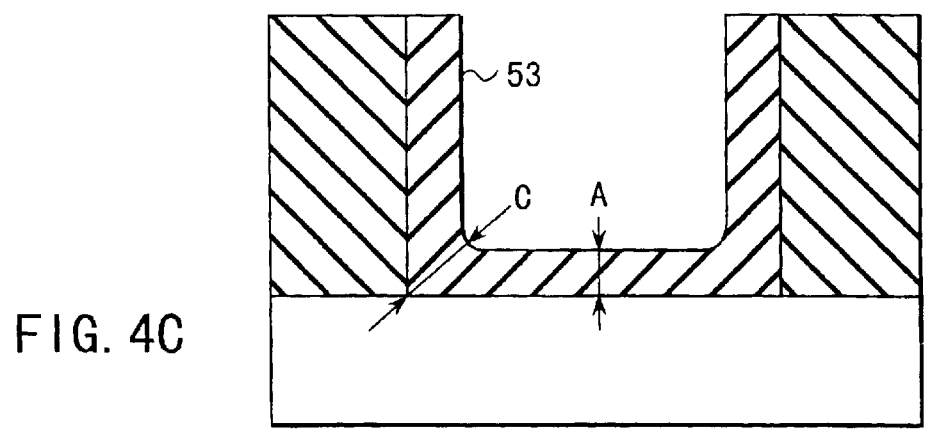
Figure 4D:
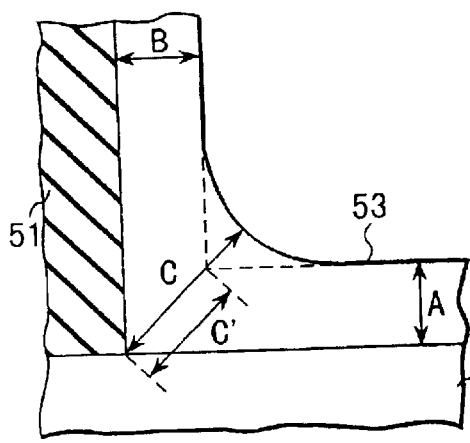

In this embodiment of the present invention, however, a TiN film is formed first by, for example, a CVD method, followed by oxidizing the TiN film into the $TiO_2$ film 53. Since a $TiO_2$ film about twice as thick as the TiN film can be obtained by oxidation, the thickness C in the corner portion is larger than 2'½ times the thickness A in the bottom portion, as shown in FIG. 4C. As a result, the electric field concentration in the corner portion is suppressed so as to markedly improve the gate breakdown voltage.

Where the thickness of the $TiO_2$ film 53 in the bottom portion of the trench differs from that in the side wall portion of the trench as shown in FIG. 4D, the relationship $C^2 > (A^2 + B^2)$ is generally met, where A represents the thickness of the $TiO_2$ film in the center of the bottom portion, B represents the thickness of the $TiO_2$ film in the center of the side wall portion, and C represents the thickness of the $TiO_2$ film in the corner portion along a line joining the intersection between the bottom portion and the side wall portion of the trench and the intersection between the upper surface and the side wall surface of the $TiO_2$ film. In short, the thickness C in the corner portion in this embodiment is larger than the thickness C' in the corner portion in the prior art.

Figure 4E:
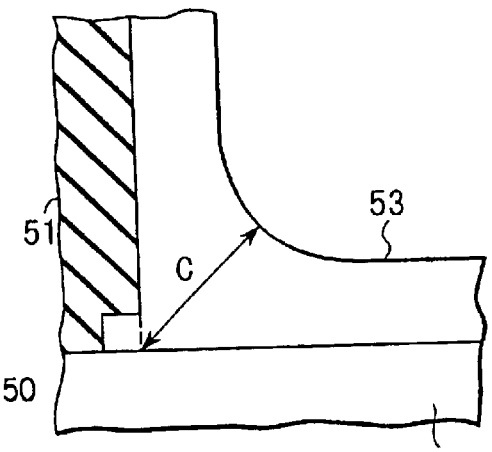

Incidentally, where the bottom portion of the $TiO_2$ film 53 bites the outer insulating film 51, the biting portion is neglected and the thickness C of the corner portion is defined as shown in FIG. 4E.

Embodiment 1(D)

The present invention can be applied not only to the gate insulating film but also to various capacitor structures, e.g., to a trench capacitor of a DRAM cell.

Figure 5A:
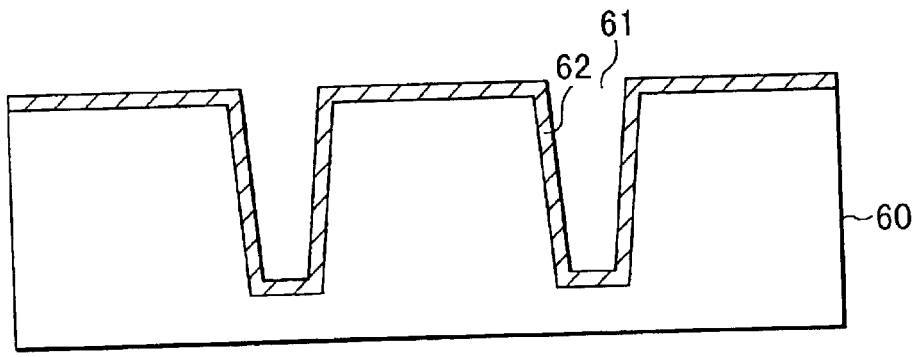
FIGS. 5A to 5C are cross sectional views showing a method of manufacturing a semiconductor device according to embodiment 1(D) of the present invention.
Figure 5B:
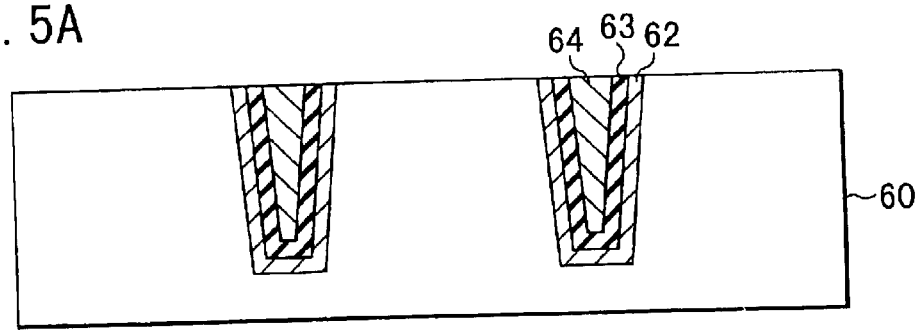
Figure 5C:
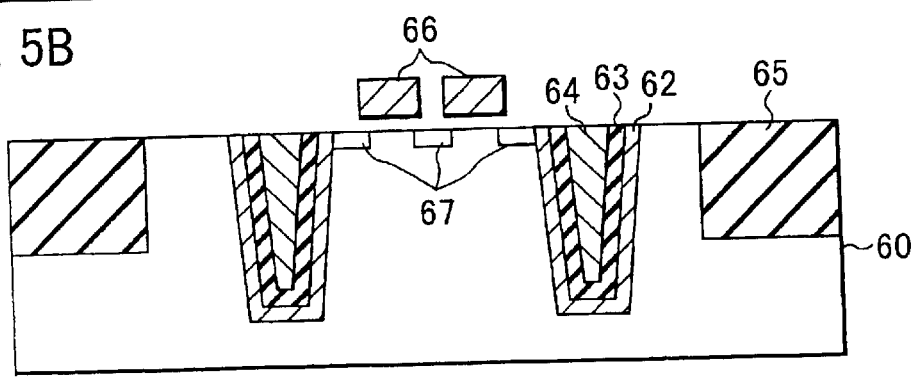

FIGS. 5A to 5C are cross sectional views showing the process for forming a DRAM cell having a trench capacitor formed therein.

In the first step, a trench 61 is formed by etching in a silicon substrate 60, followed by forming an n-type diffusion layer 62 on the inner wall of the trench by means of a gaseous phase diffusion of arsenic (As), as shown in FIG. 5A. Then, a $TiO_2$ film 63 is formed along the inner wall of the trench 61 by the method of the present invention, followed by filling the trench 61 with a polysilicon film 64, as shown in FIG. 5B. To be more specific, a thin TiN film is formed on the entire surface of the substrate including the trench, followed by oxidizing the TiN film into the $TiO_2$ film 63. Then, the polysilicon film 64 is deposited on the $TiO_2$ film 63, followed by a flattening treatment by, for example, a CMP until the substrate surface is exposed to the outside.

In the next step, an element isolating region 65 is formed, followed by forming a gate oxide film (not shown) and a gate electrode 66, as shown in FIG. 5C. Then, source-drain diffusion layers 67, etc. are formed.

In this embodiment, a capacitor insulating film free from oxygen deficiency and having a high reliability can be obtained because the $TiO_2$ film 62 is formed by oxidizing a TiN film. Further, since the film is thickened in the corner portion of the trench, the breakdown voltage of the capacitor insulating film can be improved.

Embodiment 2

Embodiment 2 of the present invention will now be described with reference to the accompanying drawings.

Embodiment 2(A)

Figure 6A:
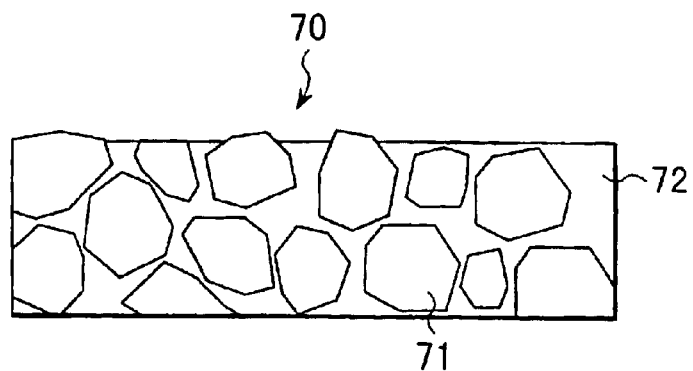
FIGS. 6A and 6B schematically show the structure of the insulating film according to embodiment 2(A) of the present invention.
Figure 6B:
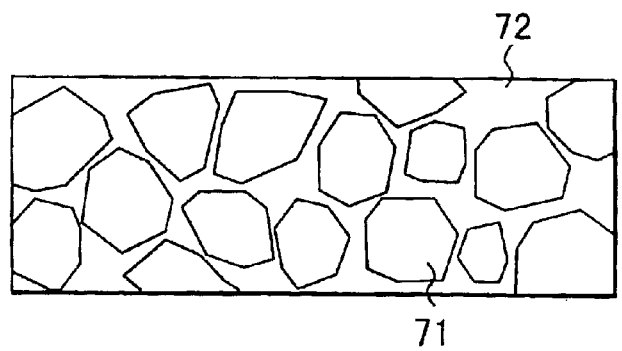

FIG. 6A is a cross sectional view showing the construction of an insulating film 70 for electrical insulation such as a gate insulating film included in a MIS transistor, and FIG. 6B is a plan view of the insulating film 70 shown in FIG. 6A.

As shown in the drawings, the insulating film (metal-containing insulating film) 70 constitutes structure A consisting of a plurality of first insulating regions 71 formed of grains containing a metal oxide and a second insulating region 72 formed of an amorphous insulating material in the region except the first insulating regions 71.

Structure A is formed by method A comprising forming a metal compound film directly or indirectly on a semiconductor substrate, and oxidizing the metal compound film to form the insulating film (metal-containing insulating film) 70 consisting of a plurality of first insulating regions 71 formed of grains containing an oxide of a metal element contained in the metal compound film and a second insulating region 72 formed of an amorphous insulating material in the region except the first insulating regions 71.

Since the insulating film 70 consists of the first insulating regions 71 and the second insulating region 72, the crystal grains contained in the first insulating regions 71 are not brought into direct contact so as to eliminate a clear crystal boundary between the crystal grains. This makes it possible to suppress the leakage current through the insulating film 70 and to suppress deterioration of the insulating properties. It follows that the characteristics and reliability can be improved by using the insulating film 70 as, for example, a gate insulating film of a MIS transistor.

Structures B, C, D and methods B, C, D given below constitute preferred embodiments of structure A and method A described above:

Structure B, Method B: The metal compound film contains the metal element forming the metal oxide and silicon. The first insulating region contains a crystal of the metal oxide. The second insulating region contains silicon, oxygen and the metal element forming the metal oxide.

Structure C, Method C: The metal compound film contains a first metal element forming a metal oxide and a second metal element differing from the first metal element. The first insulating region contains a crystal of the metal oxide. The second insulating region contains oxygen and the second metal element.

Structure D, Method D: The metal compound film contains a metal element forming the metal oxide. The first insulating region is formed of a crystal grain of the metal oxide. The second insulating region is formed of an amorphous region of the metal oxide.

Structures (1) to (11) and methods (1) to (11) given below constitute preferred embodiments of structures A–D and methods A–D given above:

(1) In structure B and method B, the first insulating region is formed of only crystal grains of a metal oxide, or contains crystal grains of the metal oxide and amorphous metal oxide.

(2) In structure D and method D, the first insulating region is formed of only a single crystal grain of a metal oxide.

(3) In structure A and method A, the crystal grains constituting the first insulating region consist of an aggregate of a plurality of single crystals (single crystals of metal oxide), in which the angle formed by the same crystal face orientations is not larger than 10°, preferably not larger than 5°. If the angle formed by the single crystals is not larger than 10°, the crystal grain boundary energy is small even if a crystal grain boundary is formed by mutual contact of the single crystals. As a result, the electrical insulating properties are scarcely deteriorated.

(4) In structure B and method B, the amorphous insulating material constituting the second insulating region contains at least a metal oxide equal to that constituting the first insulating region and silicon oxide and also contains as desired at least one of silicon oxynitride and silicon nitride. Silicon oxide, silicon oxynitride and silicon nitride are readily made amorphous and, thus, adapted for use as materials constituting the second insulating region.

(5) In structure C and method C, the crystallizing temperature of the second metal oxide containing the second metal element is higher than the crystallizing temperature of the first metal oxide containing the first metal element. Since the crystallizing temperature of the second metal oxide is higher than that of the first metal oxide, the second metal oxide tends to be made amorphous easily.

(6) In structure A and method A, used is a metal oxide having a dielectric constant higher than that of silicon oxide such as titanium oxide, zirconium oxide, hafnium oxide, tantalum oxide, niobium oxide aluminum oxide cerium oxide, yttrium oxide or yttrium-zirconium oxide.

(7) In structure A and method A, the metal element contained in the metal oxide and metal compound film includes, for example, titanium, zirconium, hafnium, tantalum, niobium, aluminum, cerium and yttrium.

(8) In structure B and method B, the metal compound film includes a metal nitride film containing silicon, a metal oxynitride film containing silicon, a metal carbonitride film containing silicon, a metal carbide film containing silicon, a metal oxide film containing silicon, and a metal carboxide film containing silicon.

(9) In structure D and method D, the metal compound film includes a metal nitride film, a metal oxynitride film, a metal carbonitride film, a metal carbide film, a metal oxide film and a metal carboxide film.

(10) In structure D and method D, the thickness of the insulating film 70 should be not larger than 10 nm, preferably not larger than 5 nm. If the insulating film 70 is formed thin, the second insulating region consisting of an amorphous metal oxide can be formed easily.

(11) In structure A and method A, the insulating film 70 is formed on a silicon substrate, a silicon oxide film, a silicon nitride film or a silicon oxynitride film in the case where the insulating film 70 is used as a gate insulating film of a MIS transistor. Particularly, if a silicon oxide film, a silicon nitride film or a silicon oxynitride film having a thickness of several atomic layers is formed between the silicon substrate and the insulating film 70, the interface state can be controlled easily, making it possible to increase the mobility of electrons and holes.

Embodiment 2(B)

Figure 7A:
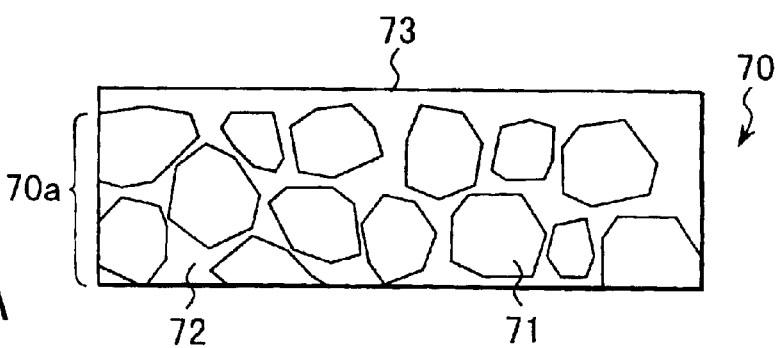
FIGS. 7A and 7B schematically show the structure of the insulating film according to embodiment 2(B) of the present invention.
Figure 7B:
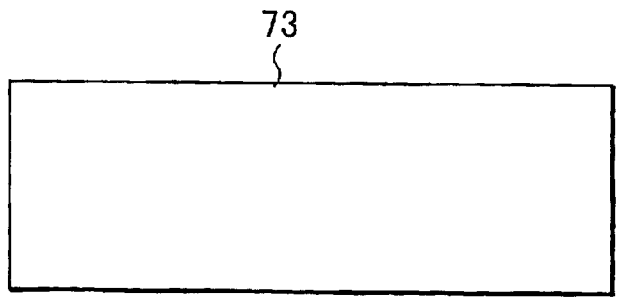

FIGS. 7A and 7B relate to embodiment 2(B) and show the construction of an insulating film for electrical insulation such as a gate insulating film of a MIS transistor. FIG. 7A is a cross sectional view, and FIG. 7B is a plan view.

In this embodiment, a covering insulating region 73 is formed to cover at least one surface region of a main insulating region 70a, which corresponds to the insulating film 70 shown in FIGS. 6A and 6B, consisting of the first insulating regions 71 and the second insulating region 72. In other words, the insulating film 70 consists of the first insulating regions 71, the second insulating region 72 and the covering insulating region 73. The covering insulating region 73 is formed of an amorphous insulating material equal to that forming the second insulating region 72. The first insulating regions 71 and the second insulating region 72 are equal to those in embodiment 1.

It is possible for the surface of the main insulating region 70a to be made irregular by the presence of the crystal grains contained in the first insulating regions 71, resulting in deterioration of morphology. In this embodiment, the deterioration of morphology is suppressed by the presence of the covering insulating region 73.

Embodiment 2(C)

Figure 8A:
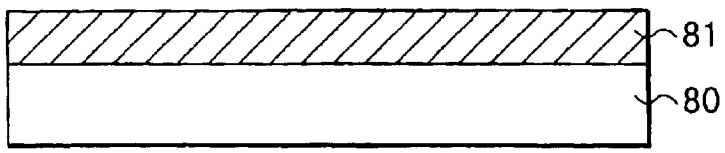
FIGS. 8A to 8C are cross sectional views showing the steps for forming an insulating film according to embodiment 2(C) of the present invention.
Figure 8B:
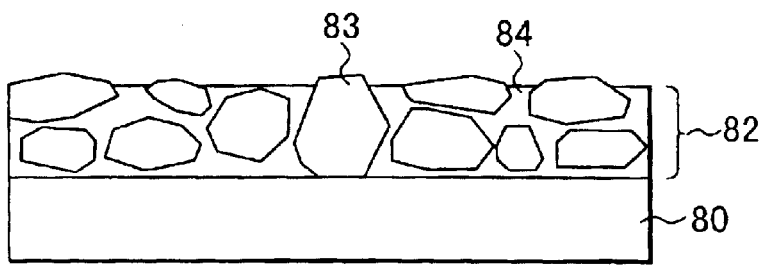
Figure 8C:
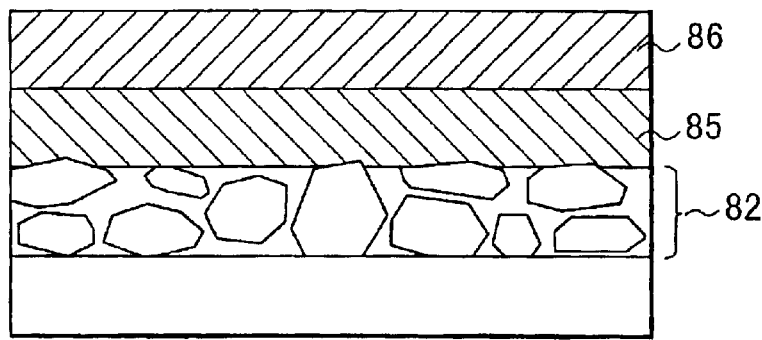

FIGS. 8A to 8C are cross sectional views showing a process of manufacturing a semiconductor device according to embodiment 2(C) of the present invention.

In the first step, a silicon-containing TiN film about 2 nm thick is formed as a metal compound layer 81 on a silicon substrate 80, as shown in FIG. 8A. The silicon-containing TiN film 81 can be formed by, for example, a CVD method under a mixed gas atmosphere containing $TiCl_4$, $NH_3$ and $SiH_4$. In addition to the $TiCl_4/NH_3/SiH_4$ mixed gas, $TiI_4/NH_3/SiH_4$ mixed gas or $TiBr_4/NH_3/SiH_4$ mixed gas can also be used. Further, the mixed gases given below can also be used for forming the silicon-containing TiN film 81:

$(C_5H_5)(C_8H_8)Ti/NH_3/SiH_4$ mixed gas;

$(C_5H_5)_2Ti[N(CH_3)_2]_2/NH_3/SiH_4$ mixed gas;

$(C_5H_5)_2TiCl_2/NH_3/SiH_4$ mixed gas;

$[(CH_3)_3SiCH_2]_4Ti/NH_3$ mixed gas;

$Ti[N(CH_3)_2]_4/SiH_4$ mixed gas;

$Ti[N(C_2H_5)_2]_4/SiH_4$ mixed gas; and $(C_5H_5)_2Ti(N_3)_2/SiH_4$ mixed gas;

In the case of using the last three mixed gases, a TiN film can be formed without using a nitriding agent such as $NH_3$ or N radicals, though it is possible to add a nitriding agent in forming the TiN film.

It is also possible to form a silicon-containing TiN film by a sputtering method (or vacuum vapor deposition method) using a Ti target containing silicon, or a Ti target containing both N and Si and a plasma of a mixed gas containing Ar, Kr or Xe and N such as $N_2$. Where a sputtering method is employed, the energy of the ions such as Ar ions for sputtering the target and the energy of the particles liberated from the target should be not higher than 100 eV, preferably not higher than 50 eV, and more preferably not higher than 20 eV. In this case, the damage done to the film surface can be diminished to form a gate insulating film having a higher reliability.

In the next step, the silicon-containing TiN film 81 is oxidized by a heat treatment applied under an $O_2$ atmosphere, an $O_3$ atmosphere, an oxygen radical atmosphere, or a steam atmosphere so as to form an insulating film 82 (gate insulating film) corresponding to structure B in embodiment 2(A), as shown in FIG. 8B. To be more specific, formed are first insulating regions 83 consisting of $TiO_2$ crystal grains and a second insulating region 84 consisting of an amorphous insulating material. At least one of titanium oxide and silicon oxide is contained in the second insulating region 84. In some cases, silicon nitride or silicon oxynitride is also contained in the second insulating region 84.

It is possible to apply the oxidizing treatment excessively to form a silicon oxide film at the interface between the silicon substrate 80 and the insulating film 82.

If the silicon-containing TiN film 81 is formed thinner, the out-diffusion of the impurities such as nitrogen generated during the oxidizing treatment as well as chlorine or carbon mixed into the silicon-containing TiN film 81 during the film formation is facilitated during the oxidizing treatment, making it possible to obtain a high quality insulating film low in impurity content. Such being the situation, it is desirable for the thickness of the silicon-containing TiN film 81 to be not larger than 5 nm, preferably not larger than 2 nm. Where it is desired to form a thick insulating film 82, the process of forming the silicon-containing TiN film 81 having a small thickness noted above and the oxidizing process are repeated several times so as to form the insulating film 82 having a desired large thickness.

In the next step, a barrier metal layer 85, e.g., a TiN film, is formed by a CVD method, followed by forming a desired metal film as a gate electrode film 86 on the barrier metal layer 85, as shown in FIG. 8C.

By the process described above, obtained is a structure in which the insulating film 82 corresponding to structure B in embodiment 2(A) is used as a gate insulating film.

Figure 9:
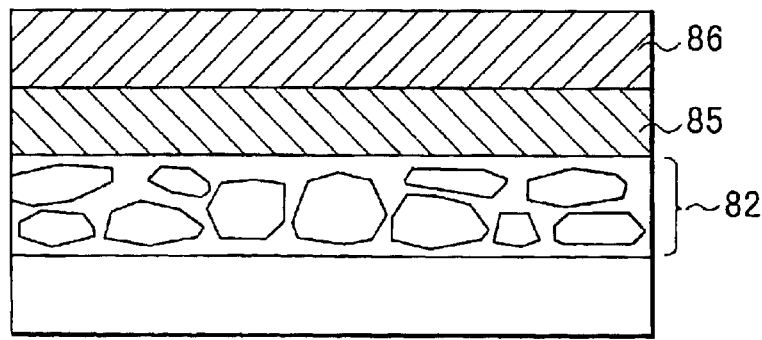
FIG. 9 is a cross sectional view showing another example of the insulating film according to embodiment 2(C) of the present invention.

In the process described above, it is possible to form an amorphous insulating region in each of the entire upper region and the entire lower region of the insulating film 82, as shown in FIG. 9.

The $TiO_2$ crystal grain 83 may be a single crystal grain or an aggregate of a plurality of single crystal grains in which the same crystal face orientations form an angle not larger than 10°, preferably not larger than 5°. As described previously, where the angle formed by single crystal grains is not larger than 10°, the crystal grain interface energy is small and, thus, the insulating properties are scarcely deteriorated.

Where the silicon-containing TiN film 81 is oxidized excessively, it is possible for a silicon oxide film to be formed at the interface between the silicon substrate 80 and the insulating film 82 and for the silicon oxide film to have an excessively large thickness. To prevent the problem, it is desirable to form a very thin silicon oxynitride film about 1 nm thick under a gaseous atmosphere containing NO, $N_2O$, etc. on the silicon substrate 80 before formation of the silicon-containing TiN film 81. The silicon oxynitride film thus formed serves to prevent the silicon substrate 80 from being oxidized. Alternatively, it is possible to form a silicon oxide film in place of the silicon oxynitride film.

In this embodiment, the insulating film 82 is formed by oxidizing the silicon-containing TiN film 81. However, there are various modifications.

Titanium is used as a metal element forming the metal oxide contained in the insulating film 82. In addition to Ti, it is also possible to use Zr, Hf, Ta, Nb and Al.

Specifically, a Si-containing TaN film is formed by a CVD method using a mixed gas of $TaCl_5/NH_3/SiH_4$, a mixed gas of $TaBr_5/NH_3/SiH_4$, or a mixed gas of $TaI_5/NH_3/SiH_4$, followed by oxidizing the Si-containing TaN film. As a result, formed are first insulating regions 83 containing $Ta_2O_5$ crystal grains and a second insulating region 84 containing tantalum oxide and silicon oxide.

Alternatively, a Si-containing $Ta_2O_5$ film containing at least 1% of C is formed by a CVD method using a mixed gas of $Ta(OC_2H_5)/SiH_4$, followed by oxidizing the $Ta_2O_5$ film with ozone to substitute O for C. As a result, formed are first insulating regions 83 containing $Ta_2O_5$ crystal grains and a second insulating region 84 containing tantalum oxide and silicon oxide.

In the case of using niobium, a Si-containing NbN film is formed by a CVD method using a mixed gas of $NbCl_5/NH_3/SiH_4$, a mixed gas of $NbBr_5/NH_3/SiH_4$, or a mixed gas of $NbI_5/NH_3/SiH_4$, followed by oxidizing the NbN film. As a result, formed are first insulating regions 83 containing $Nb_2O_5$ crystal grains and a second insulating region 84 containing niobium oxide and silicon oxide.

In the case of using zirconium, a Si-containing ZrN film is formed by a CVD method using a mixed gas of $ZrCl_4/NG_3/SiH_4$, a mixed gas of $ZrBr_4/NH_3/SiH_4$, a mixed gas of $ZrI_4/NH_3/SiH_4$, a mixed gas of $Zr[N(C_2H_5)_2]_4/NH_3/SiH_4$, or a mixed gas of $Zr[N(CH_3)_2]_4/NH_3/SiH_4$, followed by oxidizing the ZrN film. As a result, formed are first insulating regions 83 containing $ZrO_2$ crystal grains and a second insulating region 84 containing zirconium oxide and silicon oxide.

Further, in the case of hafnium, a Si-containing HfN film is formed by a CVD method using a mixed gas of $HfCl_4/NH_3/SiH_4$, a mixed gas of $HfBr_4/NH_3/SiH_4$, or a mixed gas of $HfI_4/NH_3/SiH_4$, followed by oxidizing the HfN film. As a result, formed are first insulating regions 83 containing $HfO_2$ crystal grains and a second insulating region 84 containing hafnium oxide and silicon oxide.

As described above, the amorphous second insulating region 84 containing a metal oxide and silicon oxide can be formed easily by oxidizing a metal compound film containing silicon and a metal element.

In each of the examples described above, the first insulating regions 83 containing crystals of a metal oxide and the second insulating region 84 containing a metal oxide and silicon oxide are formed by oxidizing a metal compound film containing silicon and a metal element. Alternatively, an additional method can also be employed.

Specifically, a metal compound film containing a first metal element and a second metal element differing from the first metal element is formed on the silicon substrate 80. The insulating film 82 consisting of a plurality of first insulating regions 83 formed of a metal oxide of the first metal element (first metal oxide) and the second insulating region 84 formed of an oxide of the second metal element (second metal oxide) can be formed by oxidizing the metal compound film.

In this case, the first and second metal elements should be selected such that the crystallizing temperature of the second metal oxide is higher than that of the first metal oxide. The first metal oxide formed of crystal grains and the amorphous second metal oxide can be formed by making the oxidizing temperature higher than the crystallizing temperature of the first metal oxide and lower than the crystallizing temperature of the second metal oxide. It follows that a structure similar to that shown in FIGS. 8A to BC can be obtained.

Embodiment 2(D)

Figure 10A:
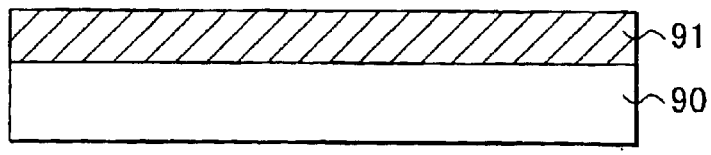
FIGS. 10A to 10C are cross sectional views showing the steps for forming an insulating film according to embodiment 2(D) of the present invention.
Figure 10B:
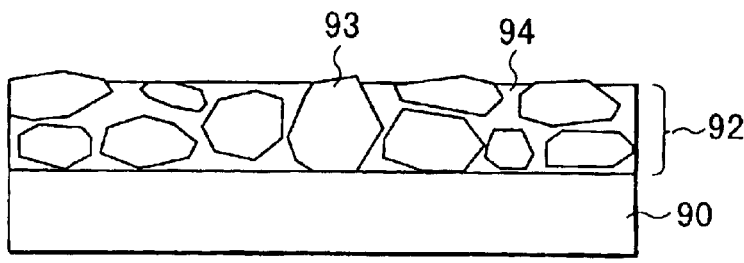
Figure 10C:
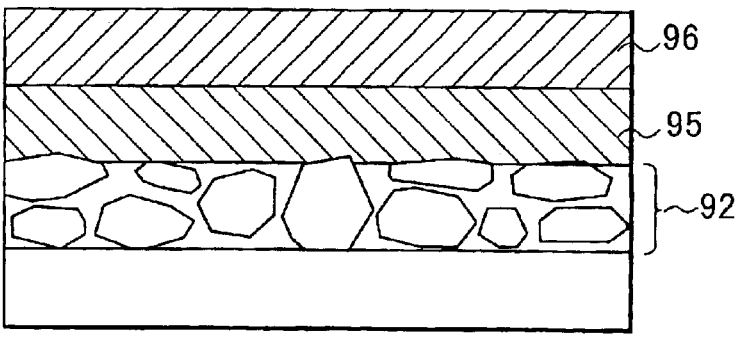

FIGS. 10A to 10C are cross sectional views showing a method of manufacturing a semiconductor device according to embodiment 2(D) of the present invention.

In the first step, a TiN film is formed in a thickness of 5 nm or less, preferably 2 nm or less, as a metal compound layer 91 on a silicon substrate 90, as shown in FIG. 10A. The TiN film 91 can be formed by a CVD method under a mixed gas atmosphere consisting of $TiCl_4$ and $NH_3$. In addition to the $TiCl_4/NH_3$ mixed gas, $TiI_4/NH_3$ mixed gas or $TiBr_4/NH_3$ mixed gas can be used. For forming the TiN film 91, it is also possible to employ mixed gases given below:

$(C_5H_5)(C_8H_8)Ti/NH_3$ mixed gas;
$(C_5H_5)_2Ti[N(CH_3)_2]_2/NH_3$ mixed gas;
$(C_5H_5)_2TiCl_2/NH_3$ mixed gas;
$[(CH_3)_3SiCH_2]_4Ti/NH_3$ mixed gas;
$Ti[N(CH_3)_2]_4$ series gas;
$Ti[N(C_2H_5)_2]_4$ series gas;
$(C_5H_5)_2Ti(N_3)_2$ series gas.

In the case of using the last three gases, a TiN film can be formed without using a nitriding agent such as $NH_3$ or N radical, though it is possible to use a nitriding agent in forming the TiN film.

It is also possible to form a TiN film by a sputtering method (or vacuum vapor deposition method) using a Ti target, or a Ti target containing N and a plasma of a mixed gas containing Ar, Kr or Xe and N such as $N_2$. Where a sputtering method is employed, the energy of the ions such as Ar ions for sputtering the target and the energy of the particles liberated from the target should be not higher than 100 eV, preferably not higher than 50 eV, and more preferably not higher than 20 eV. In this case, the damage done to the film surface can be diminished to form a gate insulating film having a higher reliability.

In the next step, the TiN film 91 is oxidized by a heat treatment at preferably 500° C. or less under an $O_2$ atmosphere, an $O_3$ atmosphere, an oxygen radical atmosphere or a steam atmosphere so as to form an insulating film 92 (gate insulating film) corresponding to structure D of embodiment 2(A), as shown in FIG. 10B. Specifically, formed are first insulating regions 93 consisting of $TiO_2$ crystal grains and a second insulating region 94 consisting of an amorphous $TiO_2$ insulating material.

Since the TiN film 91 is as thin as only 2 nm, the crystallizing energy is very large, compared with the case where the TiN film 91 has a large thickness. Therefore, growth of the crystal grains is suppressed to prevent the grown crystal grains to collide against each other, thought it is possible for the grown crystal grains to collide against each other in the case where the TiN film has a thickness not smaller than 10 nm. Since the grown crystal grains do not collide against each other, a clear crystal grain boundary is not formed. It follows that the second insulating region 94 consisting of an amorphous $TiO_2$ is formed between adjacent $TiO_2$ crystal grains (first insulating regions 93).

Figure 12:
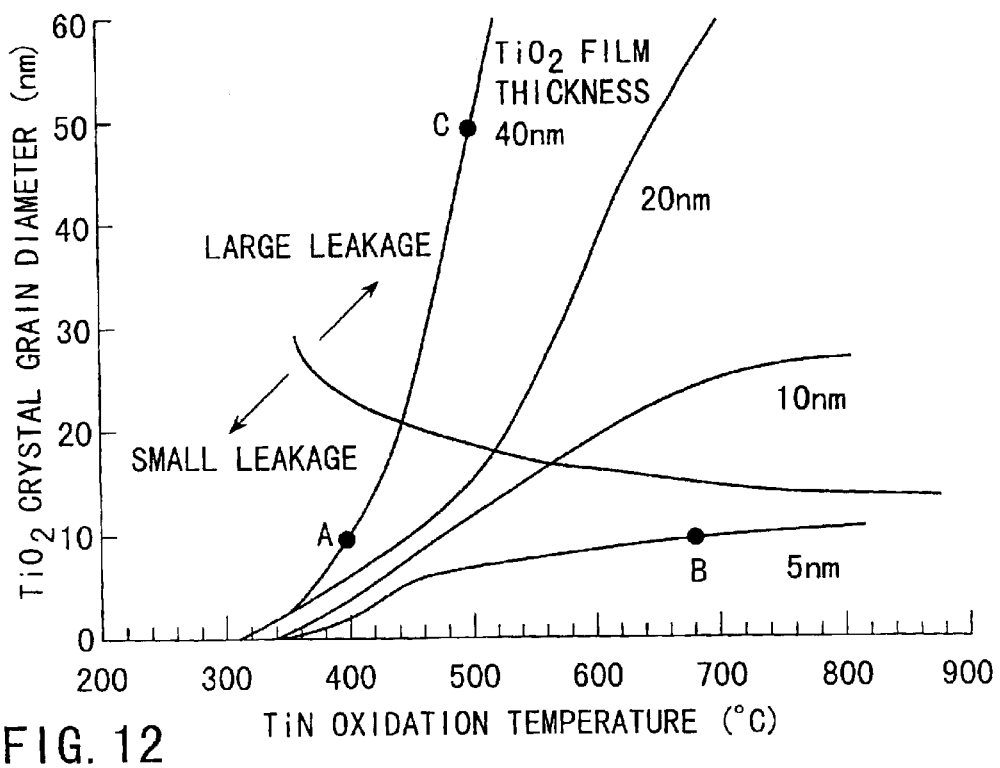
FIG. 12 is a graph showing the relationship between the oxidizing temperature of a TiN film and the crystal grain diameter of $TiO_2$, covering the case where the thickness of the $TiO_2$ film is changed.
Figure 13A:
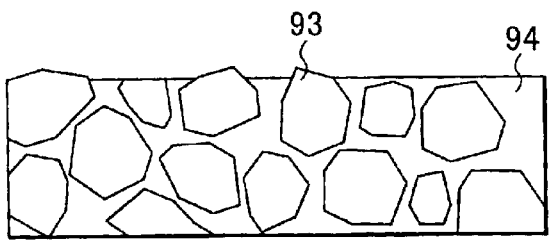
FIGS. 13A to 13C schematically show the structure of the $TiO_2$ film at points A, B and C shown in FIG. 12.
Figure 13B:
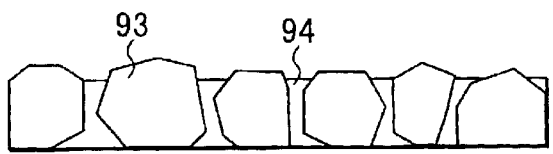
Figure 13C:
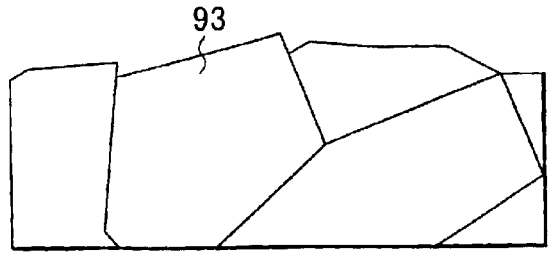
Figure 14A:
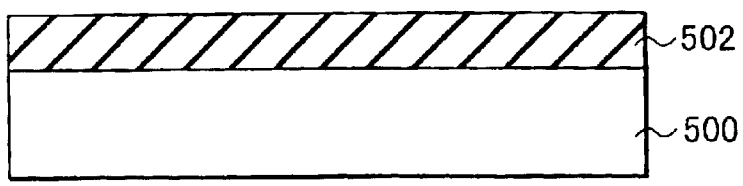
FIGS. 14A to 14C are cross sectional views showing a conventional method of manufacturing a semiconductor device.
Figure 14B:
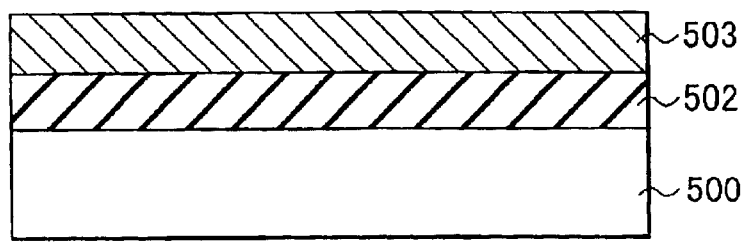
Figure 14C:
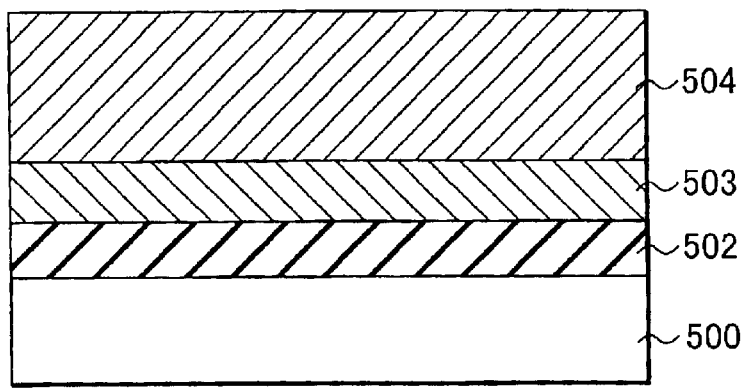
Figure 15A:
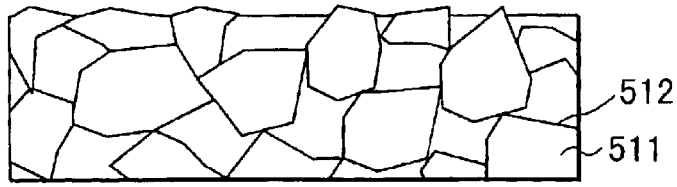
FIGS. 15A and 15B schematically show the structure a convetional insulating film.
Figure 15B:
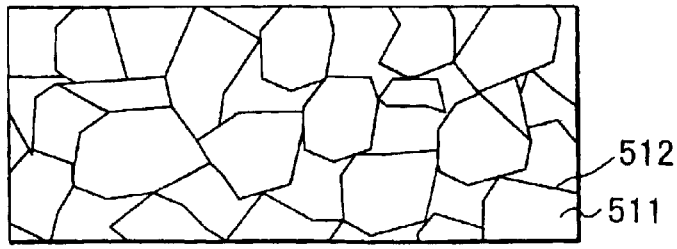

FIG. 12 is a graph showing the relationship between the oxidizing temperature of the TiN film and the $TiO_2$ crystal grain diameter, covering the case where the thickness of the $TiO_2$ film is changed. FIGS. 13A to 13C show the construction of the $TiO_2$ film at points A, B and C shown in FIG. 12.

Where the oxidizing temperature is low, $TiO_2$ crystal grains having a large grain diameter are unlikely to be formed even if the $TiO_2$ film has a large thickness (see point A in FIG. 12). As a result, the $TiO_2$ film is constructed as shown in FIG. 13A. Where the thickness of $TiO_2$ film is small, $TiO_2$ crystal grains having a large grain diameter do not grow even if the oxidizing temperature is high (see point B in FIG. 12). As a result, the $TiO_2$ film is constructed as shown in FIG. 13B. On the other hand, where the oxidizing temperature is high and the $TiO_2$ film has a large thickness, large $TiO_2$ crystal grains are grown (see point C in FIG. 12). As a result, a clear crystal grain boundary is formed between adjacent $TiO_2$ crystal grains such that the $TiO_2$ film is constructed as shown in FIG. 13C. It follows that a $TiO_2$ film having an amorphous region formed between adjacent crystal grains and low in leakage current can be formed by controlling appropriately the thickness of the $TiO_2$ film and the oxidizing temperature.

Further, a barrier metal layer 95 consisting of, for example, a TiN film is formed by a CVD method, as shown in FIG. 10C, followed by forming a desired metal film as a gate electrode film 96 on the barrier metal layer 95.

By the process described above, obtained is a structure in which the insulating film 92 corresponding to structure D in embodiment 2(A) is used as a gate insulating film.

Figure 11:
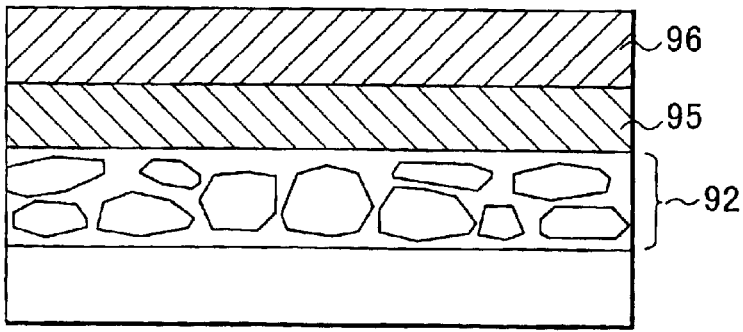
FIG. 11 is a cross sectional view showing another example of the insulating film according to embodiment 2(D) of the present invention.

In the process described above, it is possible to form an amorphous insulating region in each of the entire upper region and the entire lower region of the insulating film 92, as shown in FIG. 11.

The $TiO_2$ crystal grain 93 may be a single crystal grain or an aggregate of a plurality of single crystal grains in which the same crystal face orientations form an angle not larger than 10°, preferably not larger than 5°. As described previously, where the angle formed by single crystal grains is not larger than 10°, the crystal grain interface energy is small and, thus, the insulating properties are scarcely deteriorated.

In this embodiment, the insulating film 92 is formed by oxidizing the TiN film 91. However, there are various modifications.

Titanium is used as a metal element forming the metal oxide contained in the insulating film 92. In addition to Ti, it is also possible to use Zr, Hf, Ta, Nb and Al. Specifically, a TaN film is formed by a CVD method using a mixed gas of $TaCl_5/NH_3$, a mixed gas of $TaBr_5/NH_3$ or a mixed gas of $TaI_5/NH_3$, followed by oxidizing the TaN film. As a result, formed are first insulating regions 93 containing $Ta_2O_5$ crystal grains and a second insulating region 94 containing amorphous $Ta_2O_5$.

It is also possible to form a tantalum oxynitride film by a CVD method using a gas of $[(CH_3)_2N]_5Ta$, followed by substituting O for N by oxidizing the film. Alternatively, a tantalum oxynitride film containing at least 1% of C is formed under the mixed gas noted above, or a $Ta_2O_5$ film containing at least 1% of C is formed by using $Ta(OC_2H_5)$, followed by oxidizing these films with ozone to substitute O for C. By this method, formed is the first insulating regions 93 consisting of $Ta_2O_5$ crystal grains and the second insulating film 94 consisting of an amorphous $Ta_2O_5$. It should be noted that above described matters (containing at least 1% of C in the film, substituting O for N or C, oxidation using ozone,) are also available to other metals indicated above.

In the case of using niobium, a NbN film is formed by a CVD method using a mixed gas of $NbCl_5/NH_3$, a mixed gas of $NbBr_5/NH_3$, or a mixed gas of $NbI_5/NH_3$, followed by oxidizing the NbN film. As a result, formed are first insulating regions 93 containing $Nb_2O_5$ crystal grains and a second insulating region 94 containing amorphous $Nb_2O_5$.

In the case of using zirconium, a ZrN film is formed by a CVD method using a mixed gas of $ZrCl_4/NH_3$, a mixed gas of $ZrBr_4/NH_3$, a mixed gas of $ZrI_4/NH_3$, a mixed gas of $Zr[N(C_2H_5)_2]_4/NH_3$, or a mixed gas of $Zr[N(CH_3)_2]_4/NH_3$, followed by oxidizing the ZrN film. As a result, formed are first insulating regions 93 containing $ZrO_2$ crystal grains and a second insulating region 94 containing amorphous $ZrO_2$.

Further, in the case of hafnium, a HfN film is formed by a CVD method using a mixed gas of $HfCl_4/NH_3$, a mixed gas of $HfBr_4/NH_3$, or a mixed gas of $HfI_4/NH_3$, followed by oxidizing the HfN film. As a result, formed are first insulating regions 93 containing $HfO_2$ crystal grains and a second insulating region 94 consisting of an amorphous $HfO_2$.

As described above, the first insulating regions 93 consisting of crystal grains of a metal oxide and the second insulating region 94 consisting of an amorphous region of the metal oxide can be formed easily by oxidizing a thin metal compound film containing a metal element.

Incidentally, it is possible to apply the insulating film of embodiment 2 to the processes shown in FIGS. 3A to 3F.

Embodiment 3

Embodiment 3 of the present invention will now be described.

It is known to the art that, in performing a selective epitaxial growth of silicon, a silicon substrate fails to bear an ideal surface state because of the damage done by RIE, contamination with a gaseous impurity, etc.

In forming a facet elevated source-drain structure, it was necessary to use a silicon oxide film for forming an insulating film on the side wall of the gate to bring about a facet in the step of epitaxial growth of silicon. Therefore, it was necessary to form a side wall by etching with RIE the silicon oxide film.

In embodiment 3, a side wall of the silicon oxide film can be formed without employing an RIE technology.

Embodiment 3(A)

Embodiment 3(A) will now be described with reference to the accompanying drawings.

In the first step, an element isolating region 101 consisting of an oxide film is formed within a silicon substrate 100 by using, for example, an STI technology, as shown in FIG. 16A. The element isolating region 101 is formed as follows.

Specifically, a buffer oxide film (not shown) is formed as an etching mask on the silicon substrate 100, followed by forming a silicon nitride film (not shown) on the buffer oxide film. Then, a pattern corresponding to an element region is formed by RIE using a resist pattern (not shown) as a mask. Further, that portion of the silicon substrate 100 which corresponds to the element isolating region 101 is etched using the patterned silicon nitride film as a mask, followed by removing the resist.

In the next step, an insulating film such as a silicon oxide film is deposited on the entire surface of the substrate 100 including the element isolating region 101, followed by etching the insulating film by, for example, a CMP (Chemical Mechanical Polish) to expose the upper surface of the silicon nitride film acting as a stopper. Then, the silicon nitride film and the buffer oxide film are removed to form an element region and the element isolating region 101.

After formation of the element isolating region 101, a silicon nitride film 102 acting as a gate insulating film is formed by a CVD method on the silicon substrate 100. It is desirable for the silicon nitride film 102 to have a thickness not larger than 10 nm, particularly a thickness of 3 to 6 nm. Used in this CVD step is, for example, a mixed gas of $NH_3/SiH_2Cl_2$, a mixed gas of $NH_3/SiCl_4$, or a mixed gas of $NH_3/Si_2Cl_6$. In the case of using a mixed gas of $NH_3/SiH_2Cl_2$, a mixed gas of $NH_3/SiCl_4$, or a mixed gas of $NH_3/Si_2Cl_6$, the silicon nitride film 102 is formed at 780° C., 700° C. or 450 to 700° C., respectively. In order to prevent a nitride layer from being formed at the interface between the element isolating region 101 and the silicon substrate 100, it is necessary to prevent ammonia from entering the interface between the element isolating region 101 and the silicon substrate 100. Therefore, it is desirable to form the silicon nitride film at a low temperature. Also, it is possible to form the silicon nitride film 100 on a native oxide film or a silicon oxide film formed by using chemicals as far as the underlying layer has a thickness not larger than 3 nm.

In the next step, a polysilicon film or an amorphous silicon film 103 doped with an N-type or P-type impurity such as phosphorus, arsenic or boron is formed in a thickness of 100 to 150 nm by a CVD method on the silicon nitride film 102. Then, a silicon oxide film 104 is formed by a CVD method in a thickness of, for example, 50 nm on the polysilicon film 103.

After formation of the silicon oxide film 104, a resist pattern, not shown, is formed by a lithography method on the silicon oxide film 104, followed by selectively removing by RIE the polysilicon film 103 and the silicon oxide film 104 using the resist pattern as a mask. In this step, the silicon nitride film 102 is allowed to remain on the entire surface of the silicon substrate 100. As a result, formed is a gate structure of a laminate structure consisting of the silicon nitride film 102, the polysilicon film 103 and the silicon oxide film 104.

Then, an oxidizing treatment is applied to form a silicon oxide film (side wall) 105 selectively on the side surface of the polysilicon film 103, as shown in FIG. 16B. In this step, a silicon oxide film is not formed on the silicon substrate 100 because the surface of the silicon substrate 100 is covered with the silicon nitride film 102.

After formation of the silicon oxide film 105, the silicon nitride film 102 is removed by etching with a chemical solution such as a hot phosphoric acid, as shown in FIG. 16C. In this step, the temperature of the hot phosphoric acid should be controlled at room temperature to 180° C., preferably at about 160° C., in order to prevent the silicon substrate 100 and the element isolating region 101 from being etched. By controlling the temperature of the hot phosphoric acid appropriately in removing the silicon nitride film 102, it is possible to obtain at least 10 of an etching selectivity ratio of the silicon nitride film 102 to the silicon substrate 100 and to the silicon oxide film 104.

In the next step, a silicon or silicon-germanium film containing N- or P-type impurity in a concentration of $10^{19} cm^{-3}$ or less is formed by a selective epitaxial growth to form an epitaxial silicon layer, followed by introducing an N- or P-type impurity by ion implantation into the epitaxial silicon layer in an average concentration of at least $10^{19} cm^{-3}$. It is possible to elevate the temperature to 900 to 1100° C. at a high temperature elevation rate of at least 150° C./sec and to apply a heat treatment for a period not longer than 60 seconds so as to dope the impurity in the epitaxial layer. If the temperature for the heat treatment is lower than 900° C., the tail region of the distribution of the ion-implanted impurity fails to be sharp, with the result that it is difficult to maintain a concentration not lower than $10^{19} cm^{-3}$ to a depth of 50 nm and to control the depth of the pn junction formed inside the silicon substrate 100 at 50 nm or less.

In this fashion, a silicon crystal is selectively grown by the selective epitaxial growth of silicon on only that region of the silicon substrate 100 in which source-drain regions are to be formed so as to form elevated source-drain diffusion layers. The elevated source-drain diffusion layers are facet elevated source-drain diffusion layers 106 in which the height is gradually increased with increase in the distance from the lower end of the gate electrode. Then, the impurity contained in the facet elevated source-drain diffusion layers 106 is diffused by a heat treatment so as to form extension diffusion regions 107.

It should be noted that it is possible for a thin silicon oxide film to be formed at the interface between the silicon nitride film 102 and the silicon substrate 100 by the oxygen within the air atmosphere, by the treatment with chemicals or by the heat treatment for forming the silicon nitride film 102. To prevent the problem, it is desirable to remove the silicon nitride film 102 by a treatment with phosphoric acid, followed by removing the silicon oxide film by a treatment with hydrofluoric acid, in exposing the surface of the silicon substrate 100. It should be noted, however, that the silicon oxide film 105 and the element isolating region 101 are also etched by the treatment with hydrofluoric acid. To prevent the problem, it is desirable to set the thickness of the silicon oxide film at 3 nm or less.

It should also be noted that a metal oxide film such as a titanium oxide film can be used in place of the silicon nitride film 102. Since the titanium oxide film is insoluble in hydrofluoric acid and is soluble in a hot sulfuric acid, it is possible to obtain the effect similar to that obtained in the case of using a silicon nitride film.

As described above, in embodiment 3(A), the insulating film such as a silicon nitride film formed on the substrate is removed by a treatment with phosphoric acid in place of an RIE treatment. Thus, it is possible to form a structure in which the side wall of the gate is covered with the silicon oxide film 105 without doing a damage to the silicon substrate surface on which the selective epitaxial growth is carried out. Also, since phosphoric acid is used, the element isolating region 101 is scarcely etched and, thus, the element isolating region is not retreated. It follows that the facet elevated source-drain diffusion layer 106 can be formed easily even in the case where the side wall is formed of a silicon oxide film.

Embodiment 3(B)

In the MOSFET that is produced on a mass production basis, it is necessary to lower the resistance of the gate electrode and the source-drain diffusion layers, to increase the dielectric constant of the gate insulating film, and to form an N-type MOSFET and a P-type MOSFET within the same wafer.

Embodiment 3(B) is directed to a MOSFET in which the gate is formed of a metal electrode, the gate insulating film is formed of a high dielectric constant film, and a silicide film is formed on the source-drain diffusion layers.

Figure 17A:
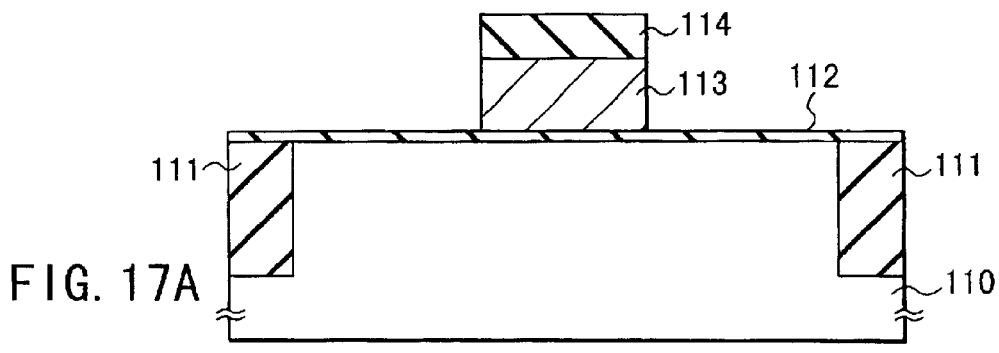
FIGS. 17A to 17M are cross sectional views showing a method of manufacturing a semiconductor device according to embodiment 3(B) of the present invention.

In the first step, an element isolating region 111 consisting of an oxide film is formed within a silicon substrate 110 by using, for example, an STI technology, as shown in FIG. 17A. Then, a silicon nitride film 112 having a thickness of 6 nm is formed on a silicon substrate 110 by a CVD method, as shown in FIG. 17A. Then, a polysilicon film 113 is formed in a thickness of 150 nm on the silicon nitride film 112, followed by forming a silicon nitride film 114 in a thickness of 50 nm on the polysilicon film 113. Since the polysilicon film 113 constitutes a dummy gate that is to be removed later, the polysilicon film 113 need not be doped with an impurity.

In the next step, a resist pattern (not shown) is formed by a lithography technology on the silicon nitride film 114, followed by etching the laminate structure consisting of the polysilicon film 113 and the silicon nitride film 114 by an RIE technology using the resist pattern as a mask. In this step, the etching is controlled to permit the silicon nitride film 112 to remain unremoved over the entire surface of the silicon substrate 110. As a result, formed is a gate structure of a laminate structure consisting of the silicon nitride film 112, the polysilicon film 113 and the silicon nitride film 114.

Figure 17B:
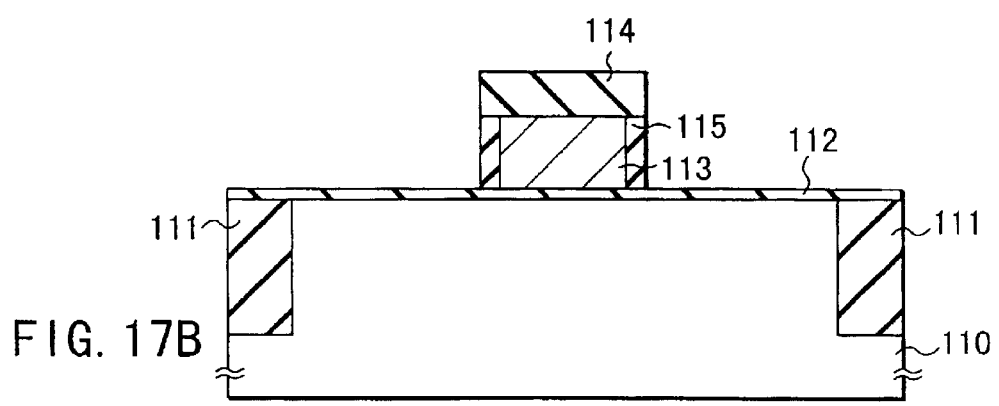

In the next step, an oxidizing treatment is performed to form a silicon oxide film 115 selectively on the side surface of the polysilicon film 113, as shown in FIG. 17B. In this step, a silicon oxide film is not formed on the surface of the silicon substrate 110 because the surface of the silicon substrate is covered with the silicon nitride film 112.

In the following manufacturing process, an N-type MOSFET and a P-type MOSFET are formed separately. In FIGS. 17C to 17M, a region A denotes an N-type MOSFET and a region B denotes a P-type MOSFET.

Figure 17C:
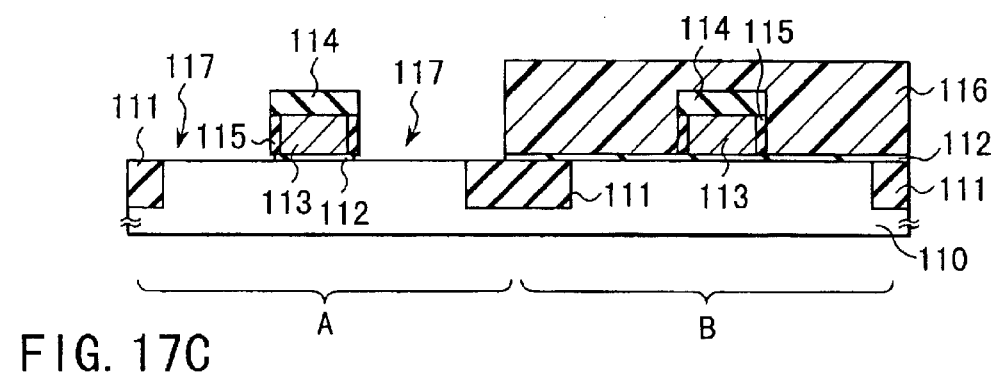

As shown in FIG. 17C, a resist pattern 116 is formed selectively on the region B by a lithography technology. Then, the silicon nitride film 112 is removed by a wet etching with phosphoric acid using the resist pattern 116 as a mask so as to expose a surface 117 of the silicon substrate in region A. In this step, the silicon nitride film 114 is also etched. However, the etching amount is negligible because the silicon nitride film 112 is very thin.

In the next step, the resist 116 is removed by the etching with a mixed solution consisting of sulfuric acid and hydrogen peroxide solution. In this step, a native oxide film (not shown) is formed on the surface 117 of the silicon substrate in region A. However, the native oxide film is removed by the hydrogen annealing at a high temperature that is carried out in an apparatus for performing an epitaxial growth.

Figure 17D:
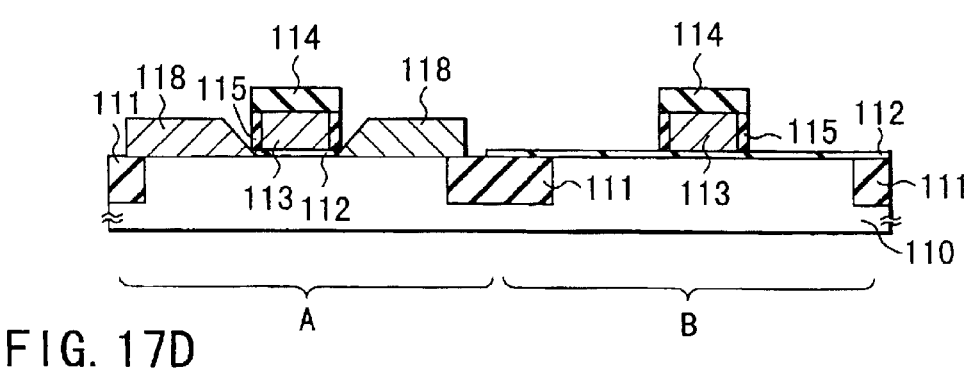

Then, silicon regions containing an N-type impurity such as phosphorus or arsenic are selectively formed on the silicon substrate surface 117 in region A by a selective epitaxial growth, as shown in FIG. 17D. Since the silicon oxide film 115 is formed on the side surface of the gate, facet elevated source-drain diffusion layers 118 are formed by the epitaxial growth. The height of the facet elevated source-drain diffusion layer 118 is set not to be larger than the height of the polysilicon film 113 forming the dummy gate. Then, the resist 116 is removed.

Figure 17E:
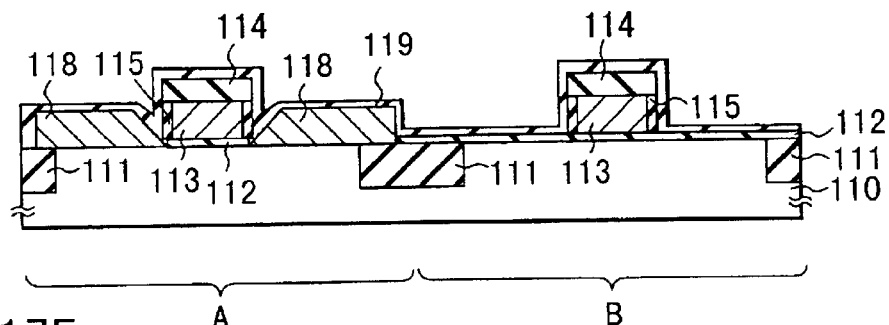

In the next step, a thin silicon nitride film 119 having a thickness 3 nm is formed on the entire surface, as shown in FIG. 17E.

Figure 17F:
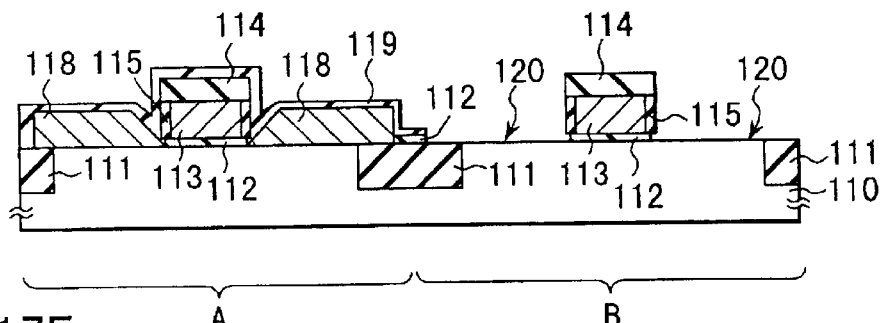

Further, a resist pattern (not shown) is selectively formed in region A by a lithography technology, as in the process shown in FIG. 17C. Then, the silicon nitride films 112 and 119 are removed by a wet etching with phosphoric acid using the resist pattern as a mask, with the result that a surface 120 of the silicon substrate is exposed in region B, as shown in FIG. 17F. In this step, the silicon nitride film 114 is also etched. However, since the silicon nitride film 112 is very thin, the etching amount of the silicon nitride film 114 is negligibly small.

Further, the resist is removed with a mixed solution consisting of sulfuric acid and hydrogen peroxide solution. In this step, a native oxide film (now shown) is formed on the surface 120 of the silicon substrate in region B. However, the native oxide film is removed by a hydrogen annealing at a high temperature that is carried out in an apparatus for performing an epitaxial growth. In this step, region A, which is covered with the silicon nitride film 119, is not affected at all.

Figure 17G:
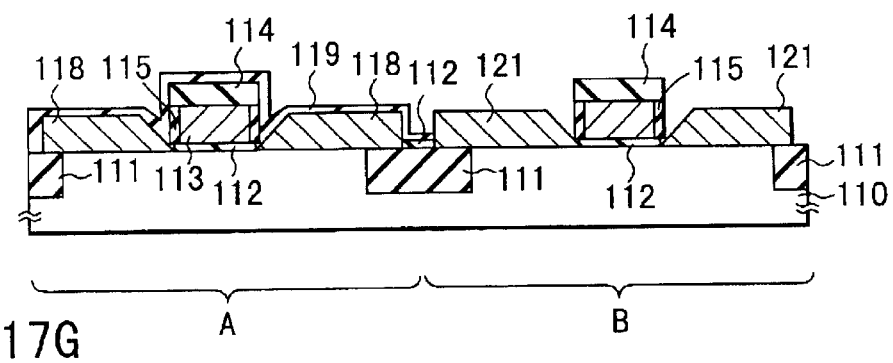

In the next step, a P-type facet elevated source-drain diffusion layers 121 are formed selectively on the surface 120 of the silicon substrate in region B by a selective epitaxial growth of silicon containing a P-type impurity such as boron, as shown in FIG. 17G. In this step, a selective epitaxial growth does not take place in region A because region A is covered with the silicon nitride film 119. The height of the P-type facet elevated source-drain diffusion layers 121 should not be larger than the height of the polysilicon film 113 constituting the dummy gate. Then, the silicon nitride film 119 is removed. In this step, the silicon nitride film 114 is also etched. However, the etching amount is negligibly small.

Figure 17H:
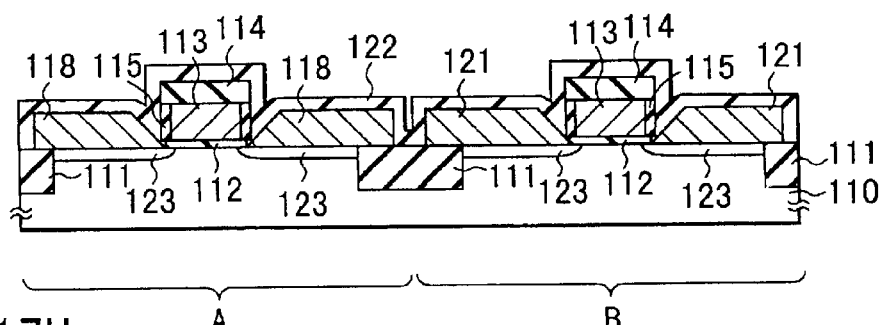

Then, a silicon nitride film 122 is formed by a CVD method in a thickness of 40 nm on the entire surface, as shown in FIG. 17H, followed by applying a heat treatment so as to diffuse the impurities contained in the N-type facet source-drain diffusion layers 118 and the P-type facet source-drain diffusion layers 121, thereby forming extension diffusion layers 123 on the silicon substrate 110. It is possible for the N-type and P-type impurities to be different from each other in the diffusion rate, making it impossible to carry out the heat treatment simultaneously. In such a case, an N-type impurity alone having a low diffusion rate such as arsenic is diffused in the process shown in FIG. 17E under a reasonably high temperature, followed by diffusing the P-type impurity having a high diffusion rate such as boron in the process shown in FIG. 17H.

Figure 17I:
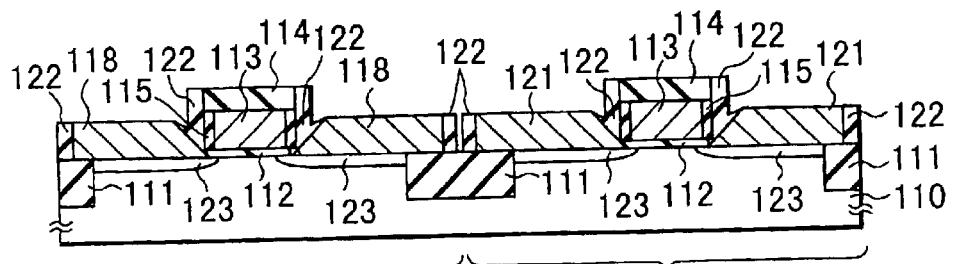

After formation of the extension diffusion layers 123, a silicon oxide film 122 is etched back by a RIE technology, as shown in FIG. 17I. By this etching back, the upper surfaces of the facet elevated source-drain regions 118 and 121 are exposed to the outside. In this step, the silicon oxide film 122 is left on the side wall of the gate and on the side wall of the facet elevated source-drain diffusion layers 118 and 121.

Figure 17J:
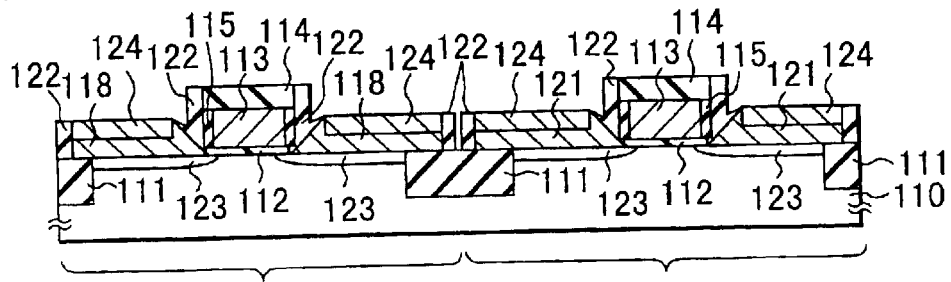

In the next step, a metal film such as a titanium film or a cobalt film is deposited on the entire surface, as shown in FIG. 17J, followed by applying a salicide technology to permit a silicide layer 124 to be formed selectively on the upper surfaces of the facet elevated source-drain diffusion layers 118 and 121.

Figure 17K:
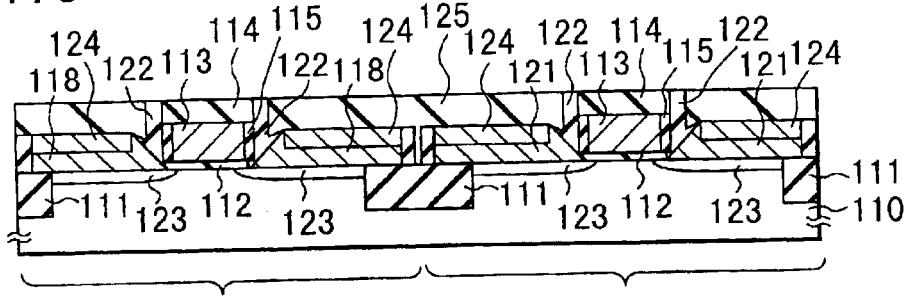

Further, an interlayer insulating film 125 consisting of an oxide film is deposited by a CVD method on the entire surface, as shown in FIG. 17K, followed by flattening the interlayer insulating film 125 by a CMP method so as to expose the surface of the silicon nitride film 114 positioned on the dummy gate. It should be noted that the height of the facet elevated source-drain diffusion layers 118 and 121 is not larger than the height of the polysilicon film 113 constituting the dummy gate. As a result, the silicide film 124 formed on the facet elevated source-drain diffusion layers 118 and 121 is not exposed to the outside.

Figure 17L:
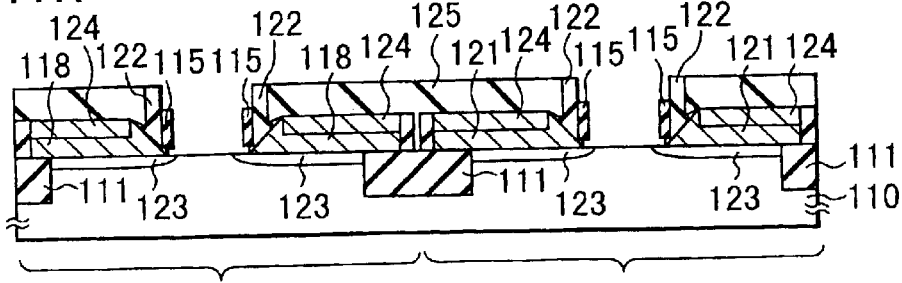

In the next step, the silicon nitride film 114 is selectively removed by a wet etching with phosphoric acid, with the interlayer insulating film 125, as shown in FIG. 17L. Then, the polysilicon film 113 is selectively removed by CDE or wet etching with the interlayer insulating film 125, the silicon oxide film 115 and the silicon nitride film 112. Further, the silicon nitride film 112 is selectively removed by etching with phosphoric acid, with the silicon nitride film 112 and the interlayer insulating film 125. As a result, the dummy gate electrode is removed to form an opening for forming a gate electrode.

Figure 17M:
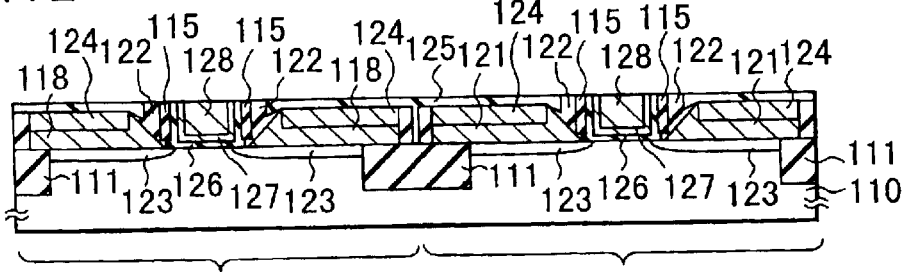

In the next step, a tantalum oxide film 126 as a high dielectric constant film is formed in a thickness of 10 nm by a CVD method on the entire surface. The tantalum oxide film 126 thus formed acts as a gate insulating film. Further, a titanium nitride film 127 is formed as a barrier film (reaction preventing film) in a thickness of 10 nm on the tantalum oxide film 126, as shown in FIG. 17M, followed by forming an aluminum film 128 as a gate electrode on the titanium nitride film 127. As shown in the drawing, the gate electrode forming region is filled with the aluminum film 128. Then, the aluminum film 128, the titanium nitride film 127 and the tantalum oxide film 126 are flattened by a CMP technology so as to form a gate electrode.

In the embodiment described above, it is possible to apply a heat treatment at a high temperature in the step between the process of forming the silicon nitride film 112 shown in FIG. 17A and the process of removing the silicon nitride film 112 shown in FIG. 17L so as to convert the lower portion of the silicon nitride film 112 into a silicon thermal nitride film. In this case, the silicon thermal nitride film is left unremoved on the surface of the silicon substrate after removal of the silicon nitride film 112 in the process shown in FIG. 17L. It is possible to use the silicon thermal nitride film or a silicon thermal oxynitride film resulting from oxidation of the silicon thermal nitride film as the gate insulating film. It is also possible to use a laminate structure consisting of the silicon thermal nitride film or silicon thermal oxynitride film and a high dielectric constant film formed on the nitride film or the oxynitride film as the gate insulating film.

It is also possible to use a metal oxide film such as a titanium oxide film in place of the silicon nitride film 112. Since the titanium oxide film is insoluble in hydrofluoric acid and soluble in a hot sulfuric acid, the titanium oxide film produces an effect similar to that produced by the silicon nitride film.

As described above, the silicon nitride film 112 is formed on the silicon substrate in embodiment 3(B). Each of these silicon nitride film and silicon oxide film can be selectively removed by a wet etching. Since the silicon nitride film 112 can be removed by a wet etching, the surface 120 of the silicon substrate 110 can be exposed to the outside without doing damage to the silicon substrate surface 120. It should be noted that the silicon oxide film is not removed in the step of removing the silicon nitride film by a wet etching with phosphoric acid. Also, in the step of removing a part of the silicon oxide film by a wet etching, the silicon nitride film can be used as a barrier film of the silicon oxide film.

Incidentally, the gate insulating film described previously in conjunction with embodiments 1 and 2 can be used in embodiment 3.

Embodiment 4

Embodiment 4 of the present invention will now be described.

It has been clarified that, in forming the elevated source-drain diffusion layers by the epitaxial growth after formation of the extension diffusion layers, it is difficult to make the N-type diffusion layer and the P-type diffusion layer equal to each other in thickness because of the difference in the impurity contained in the N-type diffusion layer and the P-type diffusion layer. In embodiment 4, the extension diffusion layers are formed after formation of the elevated source-drain diffusion layers by the epitaxial growth.

Embodiment 4(A)

Figure 18A:
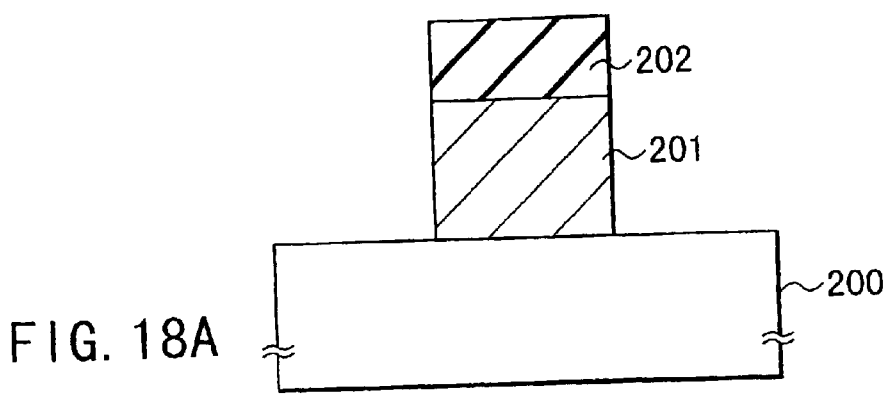

In the first step, an element isolating region (not shown) is formed by an STI technology within a silicon substrate 200, as shown in FIG. 18A. Then, the impurity concentration in a channel portion of the transistor is controlled, as desired, by injecting an impurity into a region in which a transistor is to be formed.

In the next step, a buffer oxide film (not shown) is formed on the silicon substrate 200, followed by forming a polysilicon film 201 on the buffer oxide film. It is possible to form an amorphous silicon film in place of the polysilicon film 201. Then, a silicon nitride film 202 is formed on the polysilicon film 201, followed by forming a resist pattern (not shown) on the silicon nitride film 202. Further, an anisotropic etching is applied with the resist pattern used as a mask so as to selectively remove the silicon nitride film 202 and the polysilicon film 201 and, thus, to form a dummy gate. Then, the resist is removed.

Figure 18B:
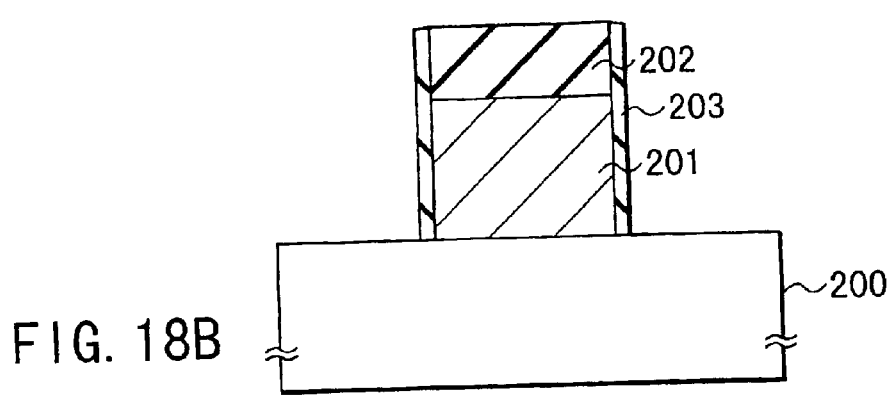

In the next step, the dummy gate is oxidized as desired, followed by forming a silicon nitride film in a thickness of 10 nm on the entire surface. Then, the silicon nitride film is anisotropically etched to form a side wall 203 consisting of a very thin silicon nitride film on the side surface of the dummy gate, as shown in FIG. 18B.

Figure 18C:
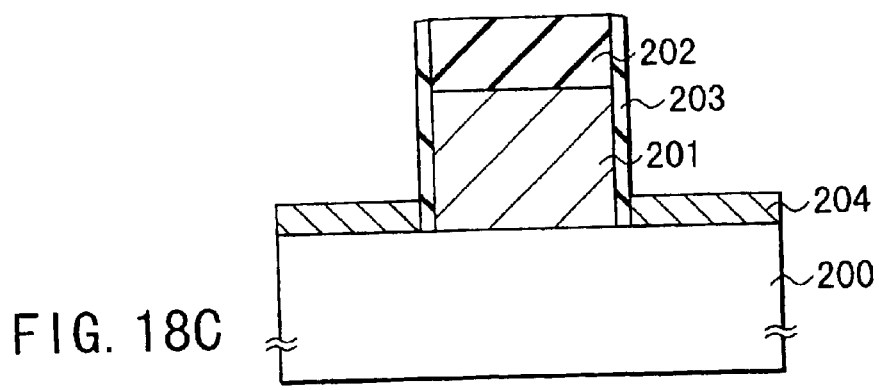

After formation of the very thin silicon nitride side wall 203, the surface of the silicon substrate 200 is washed with a dilute hydrofluoric acid and by a hot hydrogen treatment at, for example, 900° C. for 5 minutes, followed by forming an epitaxial silicon layer 204 having a thickness of 30 nm by a selective epitaxial growth of silicon, as shown in FIG. 18C. In this step, the upper surface of the dummy gate is covered with the silicon nitride film 202 and, thus, an epitaxial growth of silicon does not take place on the dummy gate. Also, since the side surface of the dummy gate is covered with the silicon nitride film 203, a facet is not generated in the epitaxial silicon layer.

Figure 18D:
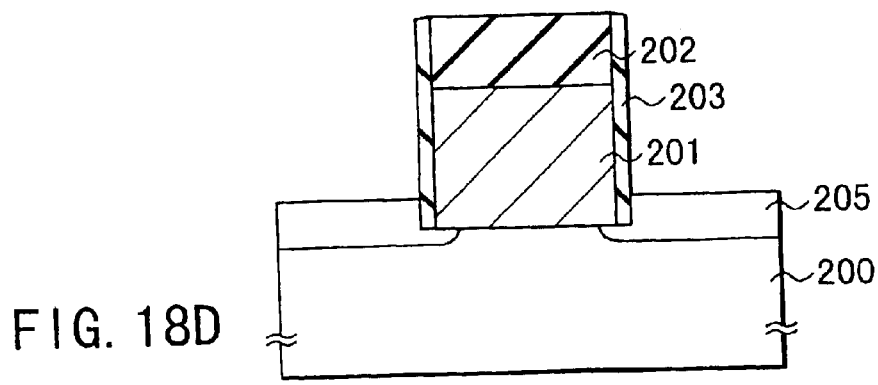

In the next step, impurity ions are implanted to form extension diffusion layers 205, as shown in FIG. 18D. Since presence of the epitaxial silicon layer 204 provides an allowance in the depth direction in performing the ion implantation, the extension diffusion layers 205 can be formed by the ordinary ion implantation technology. For example, an N-type diffusion layer can be formed under an accelerating energy of 20 keV and at a dose of $1\times10^{15} cm^{-2}$ using arsenic as an impurity. The annealing for activating the extension diffusion layer 205 can be performed at, for example, 800° C. for 10 seconds. Phosphorus can also be used as an impurity in place of arsenic. For forming a P-type diffusion layer, used is boron or boron fluoride ($BF_2$). Since the silicon nitride side wall 203 is formed thin, the extension diffusion layer 205 can be formed to reach sufficiently the edge of the dummy gate.

Then, a silicon oxide film is formed as required as an etching stopper, followed by forming a silicon nitride film 50 nm thick on the silicon oxide film.

Figure 18E:
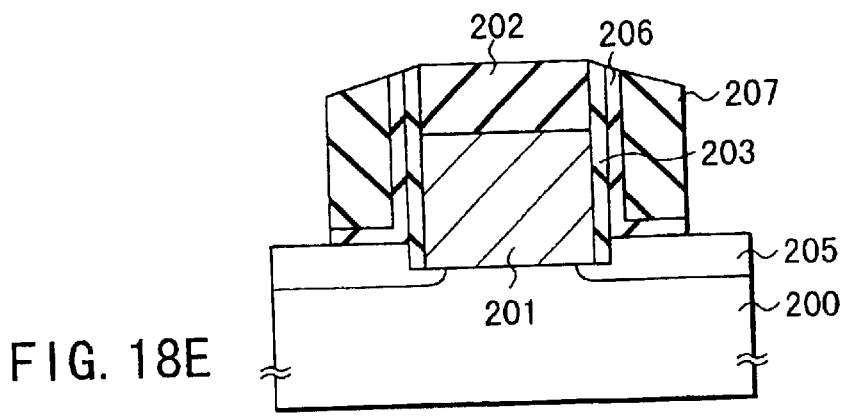
Figure 18F:
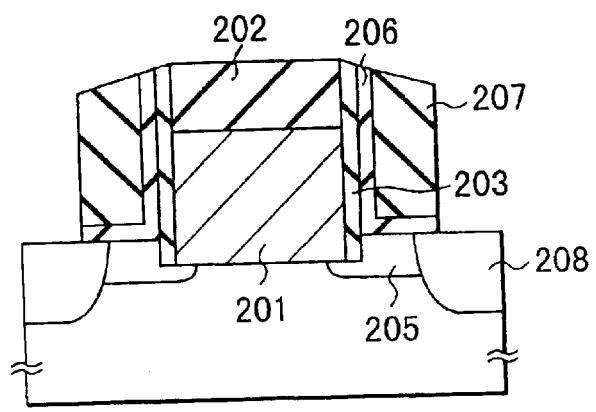

In the next step, the silicon oxide film is anisotropically etched to form a silicon oxide side wall 206 and a silicon nitride side wall 207, as shown in FIG. 18E. Further, source-drain diffusion layers 208 are formed by ion implantation using the silicon nitride side wall 207 as a mask, as shown in FIG. 18F. The annealing for activating the source-drain diffusion layers 208 is performed at 1,000° C. for 10 seconds.

Figure 18G:
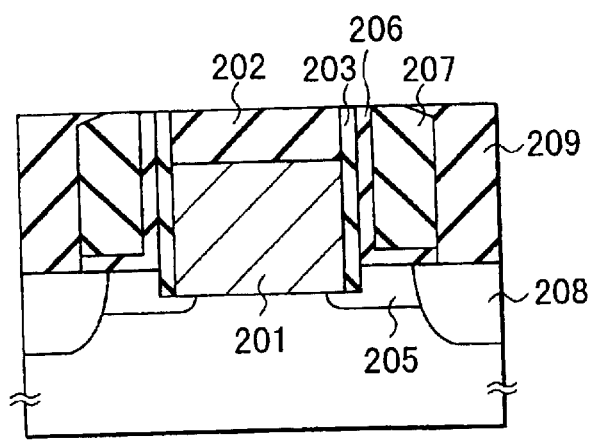

Further, an interlayer insulating film 209 is formed on the entire surface, followed by flattening the interlayer insulating film 209 by a CMP to expose the upper surface of the silicon nitride film 202 positioned on the dummy gate, as shown in FIG. 18G. It is possible to employ an etching back method in place of the CMP.

Figure 18H:
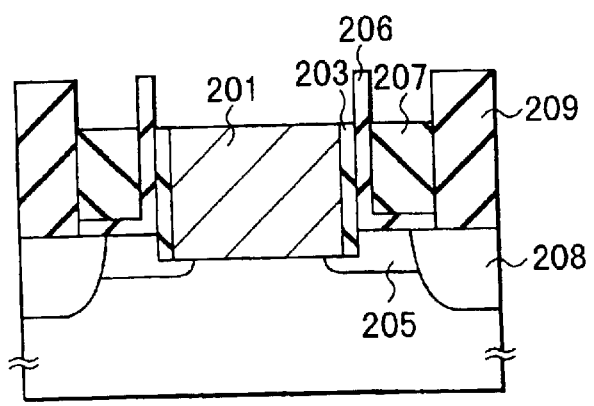

In the next step, the silicon nitride films 202, 203 and 207 are removed by the treatment with a hot phosphoric acid until the upper surface of the polysilicon film 201 is exposed to the outside, as shown in FIG. 18H. Further, the polysilicon film 201 is removed by a CDE method to form a trench 210, as shown in FIG. 18I, followed by removing the silicon oxide film (not shown) formed as a buffer layer by the treatment with a dilute hydrofluoric acid so as to expose the surface of the silicon substrate 200. After removal of the dummy gate, the local threshold voltage can be controlled by means of ion implantation through the buffer oxide film.

In the next step, a gate insulating film 211 is formed by oxidizing the surface of the exposed silicon substrate 200 or by depositing an insulating film, e.g., tantalum oxide. A metal oxide other than tantalum oxide can also be used for forming the gate insulating film 211 as far as the metal oxide has a high dielectric constant.

Then, a titanium nitride film 212 is formed as a barrier film (reaction preventing film), followed by forming a tungsten film 213 as a metal film on the titanium nitride film 212 such that the trench 210 is filled with the tungsten film 213. It is also possible to use aluminum, copper, etc. for forming the metal film. Further, it is possible to use tungsten nitride or tantalum nitride for forming the reaction preventing film. Incidentally, in the case of using a P-containing polysilicon for forming the electrode, the reaction preventing film need not be formed.

Then, flattening is performed by a CMP method to form a gate electrode 214 within the trench 210. It is also possible to employ a patterning and an etching for forming the gate electrode in place of the flattening treatment by a CMP method. The ordinary process for forming a transistor can be employed in the subsequent steps. However, a transistor of a high performance can be formed by adding the step of removing the side wall as described in the following.

Figure 19A:
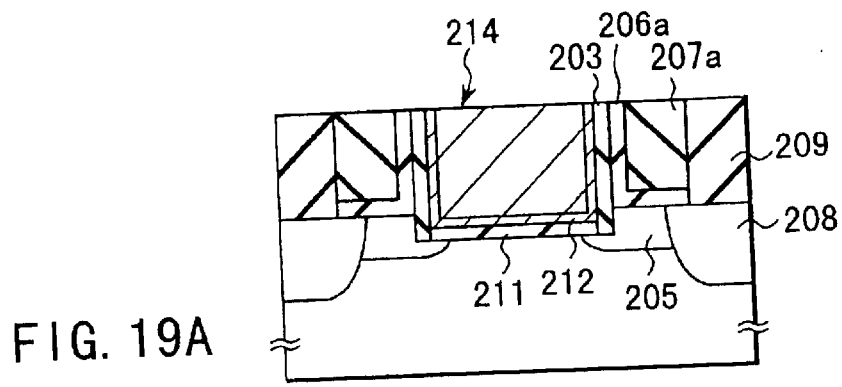
FIGS. 19A to 19D are cross sectional views showing another example of a method of manufacturing a semiconductor device according to embodiment 4(A) of the present invention.
Figure 19B:
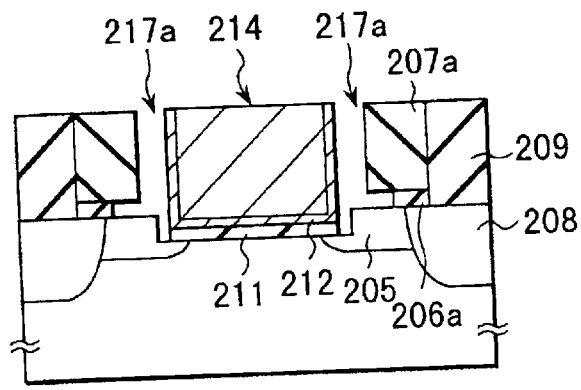
Figure 19C:
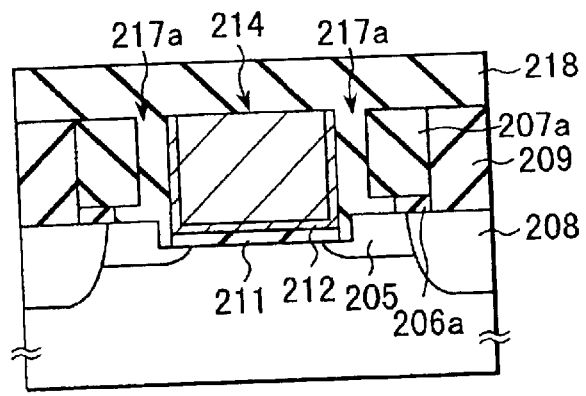
Figure 19D:
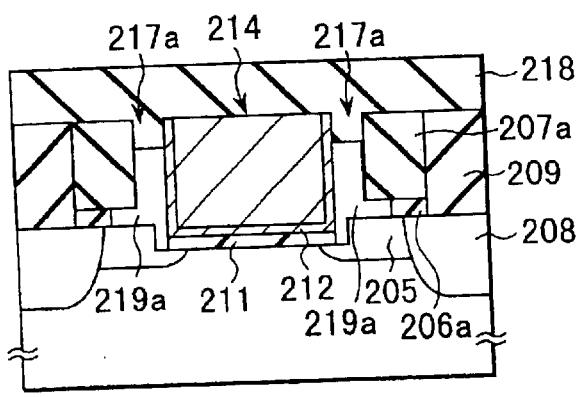

Specifically, the silicon nitride side walls 203 and 207 are removed as shown in FIG. 18K, followed by forming an interlayer insulating film 218 consisting of, for example, TEOS on the entire surface. Where, for example, the height of the gate electrode 214 is 30 nm and the thickness of the silicon nitride side wall 203 is 20 nm (condition 1), the trench 217 is filled substantially completely with the interlayer insulating film 218, as shown in FIG. 18L. On the other hand, where, for example, the height of the gate electrode 214 is 100 nm, and the thickness of the silicon nitride side wall 203 is 10 nm (condition 2), the trench 217 is not filled completely with the interlayer insulating film 218 because the aspect ratio of the height of the gate electrode 214 to the thickness of the side wall 20 is high, as shown FIG. 18M. As result, cavities 219 are formed. Presence of the cavity 219 is effective for decreasing the dielectric constant.

Where a silicon oxide side wall 207a is formed on a silicon nitride side wall 206a as shown in FIG. 19A, the silicon nitride side walls 203 and 206a are removed to form a trench 217a as shown in FIG. 19B. Under condition 1 given above, the trench 217a is filled with the interlayer insulating film 218, as shown in FIG. 19C. Under condition 2 given above, however, a cavity 219 is formed as shown in FIG. 19D.

Figure 20A:
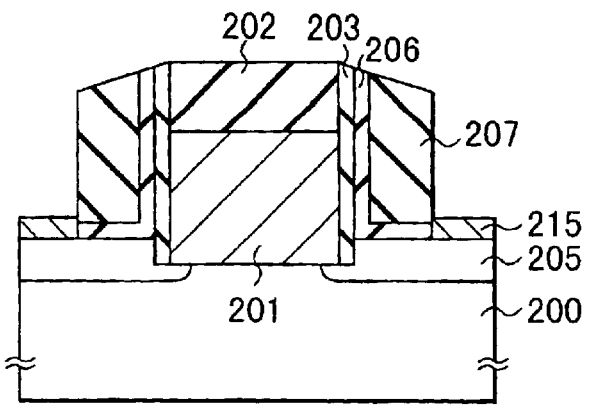
FIGS. 20A and 20B are cross sectional views showing another example of a method of manufacturing a semiconductor device according to embodiment 4(A) of the present invention.
Figure 20B:
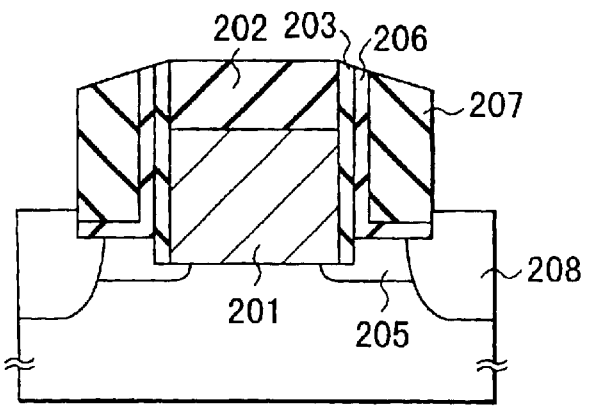
Figure 21A:
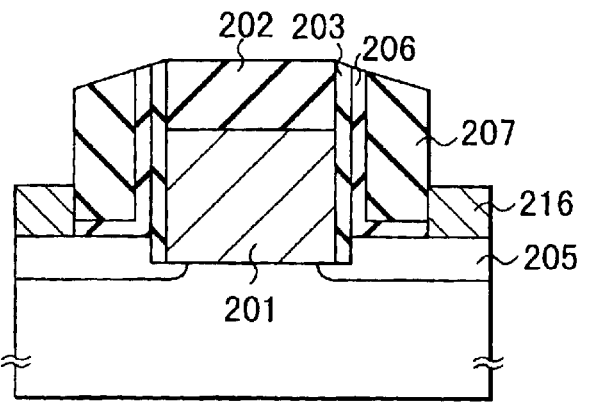
FIGS. 21A and 21B are cross sectional views showing another example of a method of manufacturing a semiconductor device according to embodiment 4(A) of the present invention.
Figure 21B:
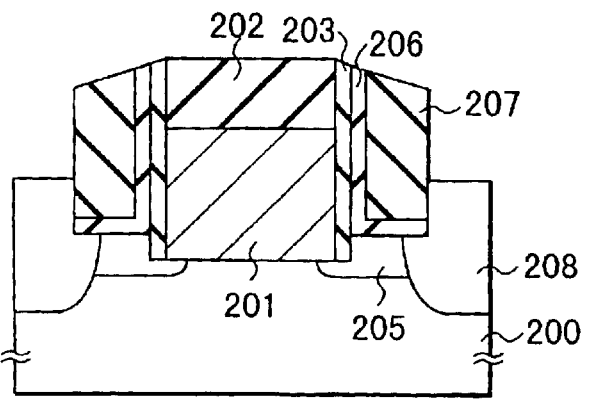

It is possible to form an epitaxial silicon layer 215 or 216 by a selective epitaxial growth as shown in FIG. 20A or FIG. 21A after the process shown in FIG. 18E and before the ion implantation. Then, source-drain diffusion layers 208 are formed by ion implantation as shown in FIG. 20B or FIG. 21B.

Silicon is consumed in the silicidation reaction. Therefore, formation of the epitaxial silicon layer 215 imparts an allowance in terms of the depth of the source-drain regions, making it possible to carry out the ion implantation in a high concentration, which is effective for decreasing the contact resistance.

As described above, an epitaxial silicon layer is formed before formation of an extension diffusion layer in this embodiment. Therefore, where N-type and P-type transistors are formed within the same substrate, the epitaxial layers can be controlled easily at the same thickness. It is also possible to prevent the extension diffusion layer from being expanded by the heat treatment in the step of the epitaxial growth.

Embodiment 4(B)

This embodiment is directed to a transistor using an ordinary polysilicon gate electrode that does not require a damascene gate process.

Figure 22A:
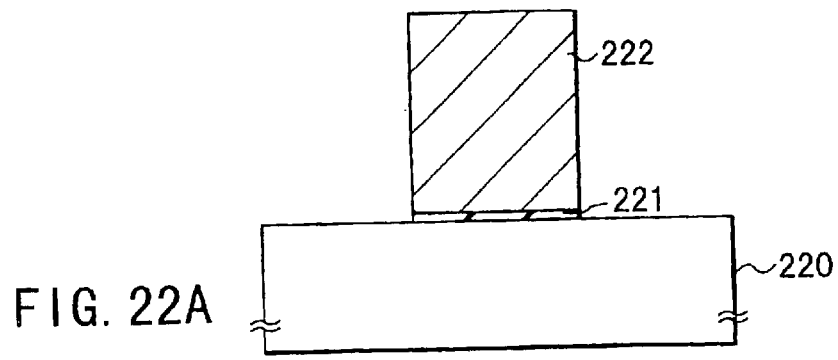

In the first step, an element region and an element isolating region (not shown) are formed within a silicon substrate 220 as in embodiment 4(A), followed by controlling the threshold value of the transistor by implanting impurity ions, as required. Then, the surface of the silicon substrate 220 is oxidized to form a gate oxide film 221 on the element region, followed by forming a polysilicon film 221 on the gate oxide film 221, as shown in FIG. 22A. The polysilicon film 222 thus formed is selectively removed by an anisotropic etching using a resist pattern (not shown) as a mask to form a gate electrode. The gate electrode may be formed of amorphous silicon in place of polysilicon. It is also possible to use polysilicon doped in advance with an impurity such as phosphorus. Further, a laminate structure consisting of a polysilicon film and a tungsten film deposited on the polysilicon film can also be used as a gate electrode.

In the next step, the etching damage is removed by oxidizing the gate electrode in a thickness of about 5 nm, followed by forming a silicon nitride film in a thickness of 10 nm.

Figure 22B:
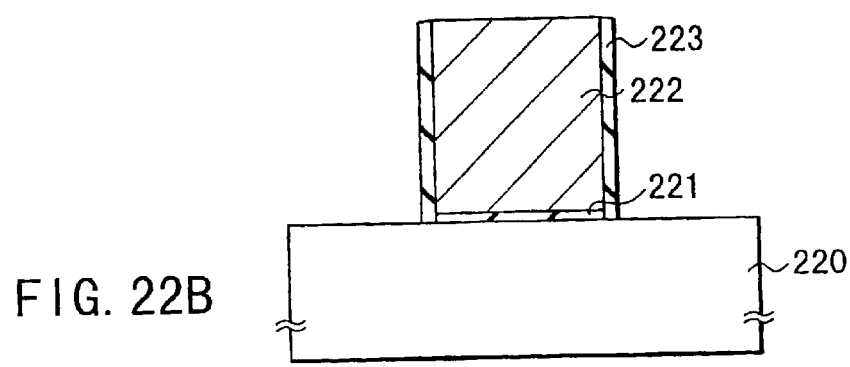

The silicon nitride film thus formed is anisotropically etched to leave a silicon nitride side wall 223 unremoved on the side surface of the polysilicon film 222, as shown in FIG. 22B. Then, a treatment with a dilute hydrofluoric acid and a hot hydrogen treatment are carried out to expose and cleanse those portions of a surface of the silicon substrate 200 which correspond to the source-drain regions.

Figure 22C:
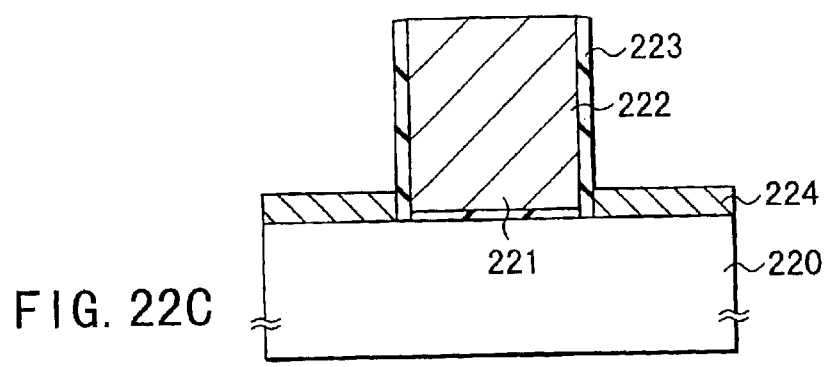

In the next step, an epitaxial silicon layer 224 is formed in a thickness of 30 nm on the substrate 200 by a selective epitaxial growth, as shown in FIG. 22C. It is possible for a silicon layer to grow on the upper surface of the polysilicon film 222. However, the transistor characteristics are not affected by the silicon layer thus grown. It should also be noted that, since the silicon nitride film 223 is formed on the side wall of the polysilicon film 222, a facet is not generated in the epitaxial silicon layer 224.

Figure 22D:
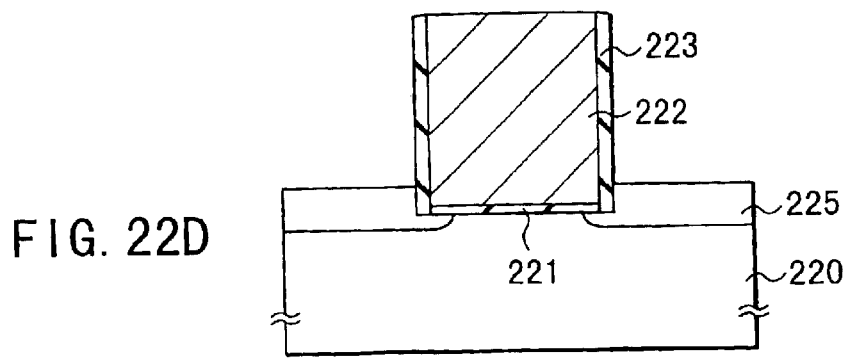

In the next step, impurity ions are implanted into the epitaxial silicon layer 224 to form an extension diffusion layer 225, as shown in FIG. 22D. In the case of forming an N-type diffusion layer, arsenic ions are implanted as an impurity under an accelerating energy of 20 keV and at a dose of $1 \times 10^{15}$ $cm^{-2}$. The annealing for activating the extension diffusion layer 225 is performed at, for example, 800° C. for 10 seconds. Then, a silicon oxide film is formed as desired as an etching stopper, followed by forming a silicon nitride film in a thickness of 50 nm on the silicon oxide film.

Figure 22E:
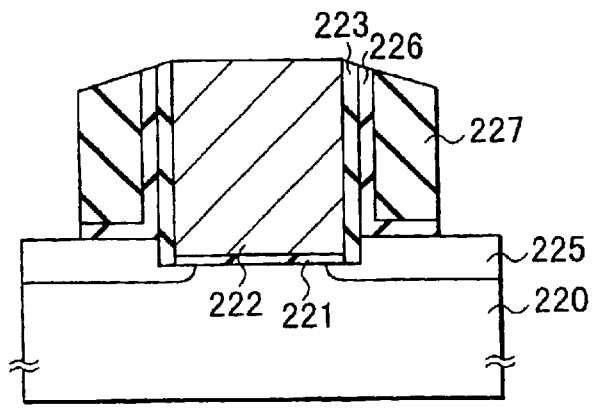
Figure 22F:
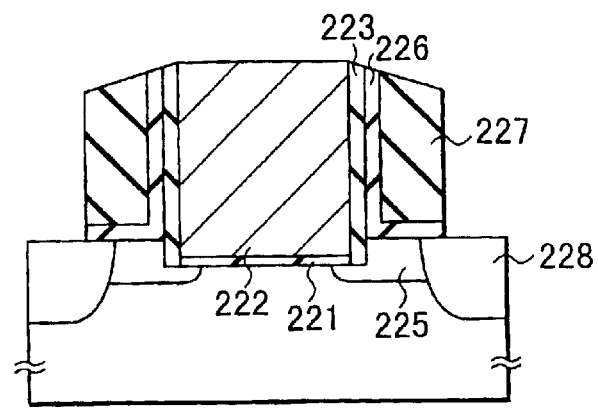

In the next step, a silicon oxide side wall 226 and a silicon nitride side wall 227 are formed on the side surfaces of the polysilicon film 222 by an anisotropic etching, as shown in FIG. 22E, followed by forming source-drain diffusion layers 228 by means of ion implantation using the silicon nitride side wall 227 as a mask, as shown in FIG. 22F. The annealing for activating the source-drain diffusion layers 228 and the gate electrode is performed at, for example, 1,000° C. for 10 seconds.

It is possible to form an epitaxial silicon layer by a selective epitaxial growth after the process shown in FIG. 22E and before the ion implantation. It should be noted that silicon is consumed by the silicidation reaction. Therefore, the epitaxial silicon layer formed in advance serves to replenish silicon during the silicidation reaction. It should also be noted that it is possible to inject an impurity into the gate electrode consisting of polysilicon so as to use the impurity-containing polysilicon layer as a gate wiring.

As described above, an epitaxial silicon layer is formed before formation of the extension diffusion layer in embodiment 4(B) as in embodiment 4(A). As a result, an effect similar to that produced in embodiment 4(A) can also be produced in embodiment 4(B).

Incidentally, the insulating film described previously in conjunction with embodiments 1 and 2 can also be used in embodiment 4.

Embodiment 5

Embodiment 5 of the present invention will now be described.

It is known to the art that, in forming a gate insulating film after formation of a silicide film, the metal in the silicide film is migrated into the gate insulating film so as to deteriorate the reliability of the gate insulating film.

In this embodiment, a gate insulating film is formed first, followed by forming a silicide film. In other words, the gate insulating film is formed in this embodiment before formation of a silicide film on the source-drain diffusion layers.

Also, in this embodiment, a gate structure of a metal single layer is formed by a damascene gate process.

Figure 23A:
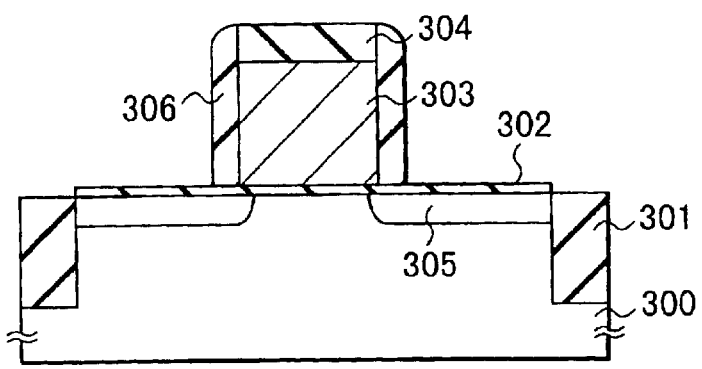
FIGS. 23A to 23J are cross sectional views showing another example of a method of manufacturing a semiconductor device according to embodiment 5 of the present invention.

In the first step, an element isolating region 301 is formed within a semiconductor substrate 300, as shown in FIG. 23A, followed by forming a gate oxide film 302 as a dummy gate in a thickness of 6 nm on the semiconductor substrate 300. Then, a polysilicon film 303 in a thickness of 250 nm is formed on the gate oxide film 302, followed by forming a silicon nitride film 304 in a thickness of 50 nm on the polysilicon film 303. Further, the polysilicon film 303 and the silicon nitride film 304 are selectively removed by using a resist pattern (not shown) as a mask so as to form a dummy gate of a laminate structure.

After formation of the dummy gate, extension diffusion regions 305 are formed within the semiconductor substrate by ion implantation of an impurity. Then, a silicon nitride film is formed on the entire surface, followed by anisotropically etching the silicon nitride film to form a silicon nitride side wall 306 having a width of 40 nm on the side surface of the dummy gate.

Figure 23B:
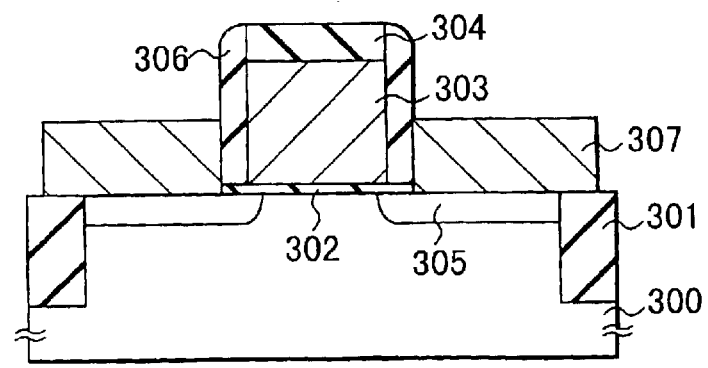

In the next step, the gate oxide film on the substrate is removed by the treatment with hydrofluoric acid so as to expose those portions of the surface of the semiconductor substrate 300 which are positioned corresponding to the source-drain regions, as shown in FIG. 23B. Then, epitaxial silicon layers are selectively grown on the exposed surfaces of the semiconductor substrate 300 to form elevated source-drain diffusion layers 307 having a height of 70 nm from the surface of the semiconductor substrate 300. In this step, a facet is not formed in the elevated source-drain diffusion layer 307 because the silicon nitride film 306 is formed on the side surface of the dummy gate.

Then, source-drain diffusion regions (not shown) are formed by an ion implantation technology. Incidentally, it is possible to form the extension diffusion regions 305 by solid phase diffusion of an impurity in the step of forming the source-drain diffusion layers in place of forming the extension diffusion regions 305 in the process shown in FIG. 23A.

Figure 23C:
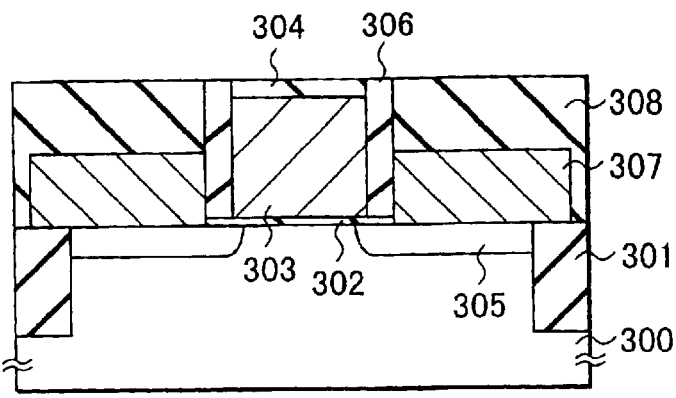

In the next step, an interlayer insulating film 308 is formed on the entire surface, as shown in FIG. 23C. Then, the interlayer insulating film 308 is flattened by a CMP method so as to expose the upper surfaces of the silicon nitride films 304 and 306 to the outside. It should be noted that the upper surfaces of the elevated source-drain diffusion layers 307 are positioned lower than the upper surface of the dummy gate and, thus, the upper surfaces of the source-drain diffusion layers 307 are not exposed to the outside.

Then, the silicon nitride film 304 is removed by the treatment with phosphoric acid, followed by removing the polysilicon film 303 by a CDE method or a wet etching. Further, the dummy gate oxide film 302 is removed by the treatment with hydrofluoric acid so as to form an opening in the gate-forming portion.

Figure 23D:
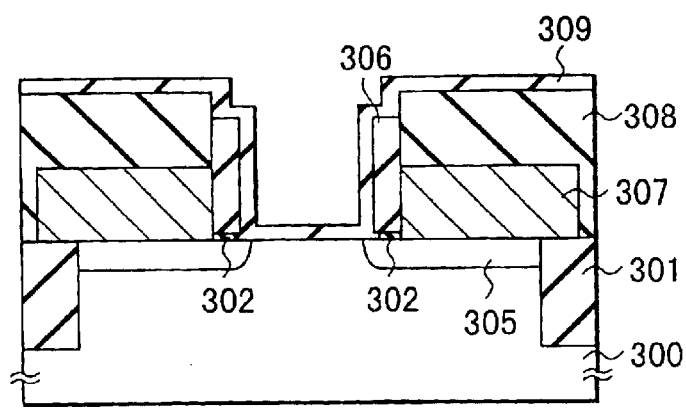

In the next step, a gate insulating film 309 is formed by an oxidizing treatment, a CVD method or deposition of a material having a high dielectric constant using a CVD method, as shown in FIG. 23D. In this stage, it is possible to form a gate insulating film into which a metal is not migrated because a silicide film is not formed on the source-drain regions. Also, even if an ion implantation treatment and an activating treatment are performed after formation of the gate-forming portion, a metal does not migrate into the gate insulating film so as to prevent the reliability of the gate insulating film from being lowered. It follows that it is possible to apply an ion implantation into the channel region after formation of the gate-forming portion. Since a high temperature step such as a step of forming the source-drain diffusion layers is not included in the subsequent process, it is possible to form a channel structure having a very sharp impurity depth profile.

Figure 23E:
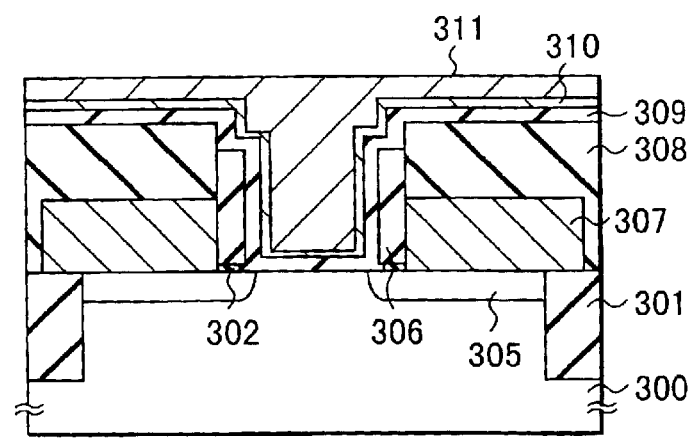

In the next step, a titanium nitride film 310 is formed as a barrier film (reaction preventing film) on the entire surface, followed by forming an aluminum layer 311 providing a metal gate electrode material by a CVD method on the titanium nitride film 310, as shown FIG. 23E.

Figure 23F:
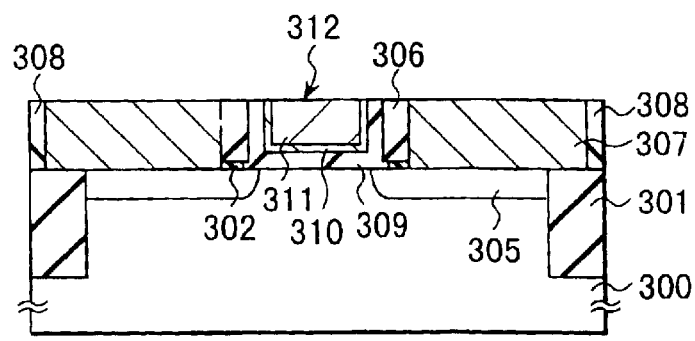
Figure 23G:
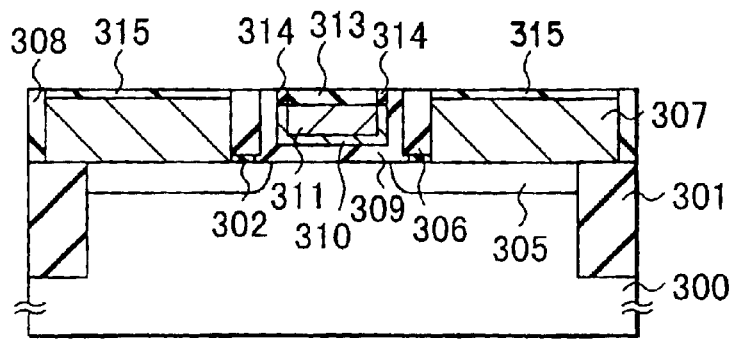

Then, a flattening treatment is applied by a CMP method to the aluminum layer 311, the titanium nitride film 310, the gate insulating film 309 and the silicon nitride side wall 306 so as to expose the upper surface of the elevated source-drain diffusion layers 307 to the outside and to form a gate electrode 312, as shown in FIG. 23F.

In the next step, an oxidizing treatment is applied to form an aluminum oxide film 313 and a titanium oxide film 314 on the surface of the gate electrode 312. Also formed is a silicon oxide film 315 on the elevated source-drain diffusion layer 307.

Figure 23H:
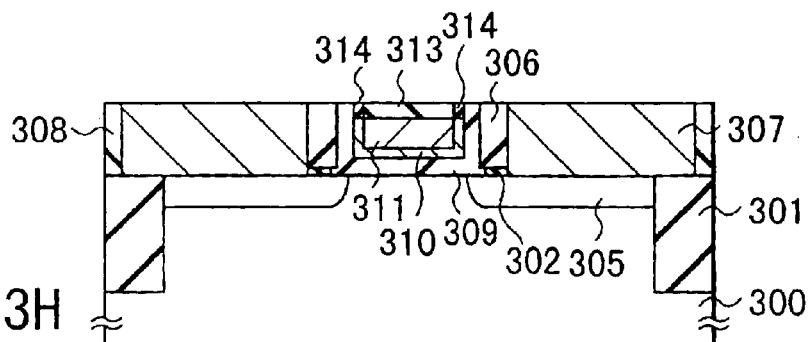

In the next step, the silicon oxide film 315 on the elevated source-drain diffusion layer 307 is removed by the treatment with hydrofluoric acid, as shown in FIG. 23H. In this step, the aluminum oxide film 313 and the titanium oxide film 314, which are insoluble in hydrofluoric acid, are not removed.

Figure 23I:
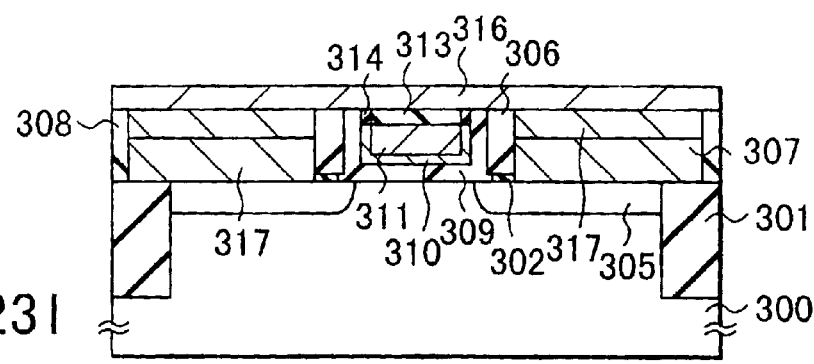

Then, a metal film 316 is formed on the entire surface, as shown in FIG. 23I. The metal film 316 is formed of a noble metal forming a silicide at a temperature lower than the melting point of aluminum. To be more specific, the metal film 316 is formed of, for example, palladium, nickel, platinum or cobalt. It also possible to use an alloy containing at least one of these noble metals.

Figure 23J:
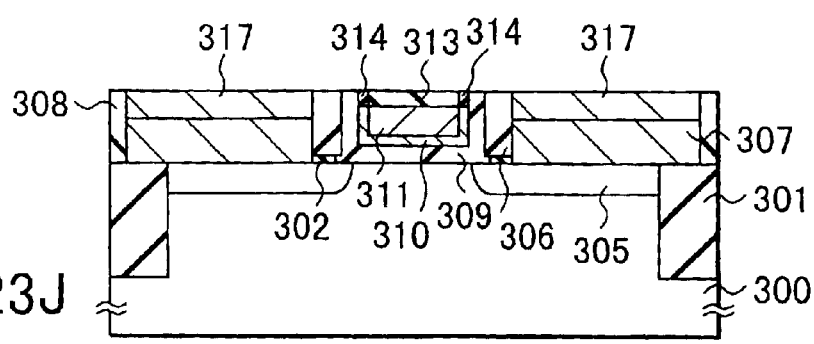

Then, a silicide film 317 is selectively formed by a heat treatment, as shown in FIG. 23J. In this step, a silicidation reaction does not take place on the surface of the gate electrode 312 because the aluminum oxide film 313 and the titanium oxide film 314 are formed on the surface of the gate electrode 312. As a result, the silicidation reaction takes place selectively on the surface of the elevated source-drain diffusion layer 307.

In order to prevent the leakage current, the silicide film 317 is formed in a height of at least 60 nm from the bottom of the extension diffusion region 305. Also, the depth of the extension diffusion region 305 from the surface of the silicon substrate 300 is set at 50 nm to 60 nm.

In the next step, the metal film 316 that is not subjected to a silicidation reaction is removed, as shown in FIG. 23J. The metal film 316 can be removed by a wet etching. Alternatively, the unreacted metal film 316 can also be removed by a flattening process such as a CMP process because the unreacted metal film 316 is formed on a flat surface.

As described above, the unreacted metal film in the salicide process can be removed by a flattening process such as a CMP process. Therefore, it is possible to eliminate the problem inherent in the wet etching such as the metal residue, the disappearance of the gate electrode or the dissolution of the silicide, making it possible to remove easily various unreacted metals. It follows that it is possible to use metals such as palladium, though such metals were not used in the past in the semiconductor device because it is difficult to achieve a selective etching in the wet etching process.

Figure 24:
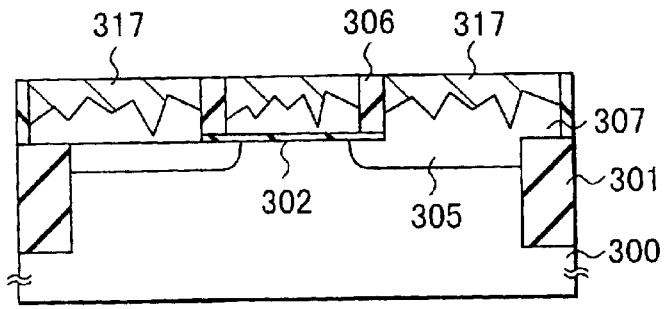
FIG. 24 is a cross sectional view showing a morphological deterioration at the interface between a silicon layer and a silicide layer.

Palladium silicide ($Pd_2Si$) is advantageous in some respects over titanium silicide or cobalt silicide used nowadays. It should be noted that a ratio of $D_{silicon}$, which represents the thickness of the silicon film consumed in forming palladium silicide, to $D_{silicide}$ which represents the thickness of the formed silicide film, i.e., $D_{silicon}/D_{silicide}$, is about 0.5, whereas, the corresponding ratio is about 1 in each of a titanium silicide film and a cobalt silicide film. What should be noted is that the amount of silicon consumed when noble metals such as palladium form a silicide is smaller than that consumed when titanium or cobalt forms a silicide. With increase in the amount of silicon consumed in forming a silicide, the morphology at the interface between silicon and silicide is deteriorated, as shown in FIG. 24, leading to an increased leakage current through the diffusion layer. Therefore, the increase in the leakage current can be prevented by using palladium silicide.

Incidentally, the silicon consumption in forming a silicide can be suppressed in the case of using platinum in addition to palladium. The $D_{silicon}/D_{silicide}$ ratio for platinum is about 0.7.

Embodiment 5 is advantageous in the step of forming a contact hole after the step shown in FIG. 23J. Specifically, since the structure shown in FIG. 23J has a flat upper surface, the interlayer insulating film can be formed easily. Also, the interlayer insulating film can be formed thin. As a result, it is possible to diminish the aspect ratio of the contact hole, making it possible to fill easily the contact hole. Also, it is possible to omit the flattening process of the interlayer insulating film using CMP and the re-flow process of the interlayer insulating film.

Figure 25:
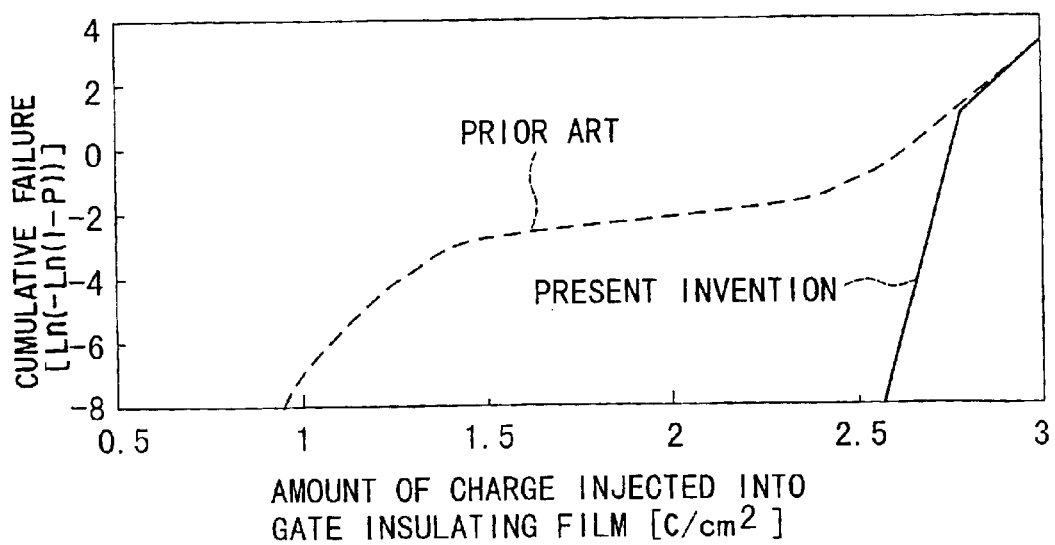
FIG. 25 is a graph showing the relationship between the amount of charge injected into the gate insulating film and the cumulative failure.

FIG. 25 is a graph showing by Weibull plot the reliability of a gate insulating film measured by TDDB (Time Dependent Dielectric Breakdown). In the graph of FIG. 25, the amount of charge injected into the gate insulating film is plotted on the abscissa, with the cumulative failure being plotted on the ordinate. The data of the prior art and the data of this embodiment are shown in the graph of FIG. 25.

FIG. 25 shows that, in the conventional Weibull plot, the total charge amount at which the failure takes place is nonuniform among the chips in the same wafer. This indicates that chips in which the failure of the gate tends to take place are present in the same wafer, leading to a low reliability of the product. The failure of the gate is caused by a metal migrating into the gate oxide film or into the interface with the oxide film.

On the other hand, in the Weibull plot for this embodiment of the present invention, the total charge amount at which the failure of the gate takes place is substantially uniform in any chip within the same wafer. In other words, this embodiment of the present invention makes it possible to prevent a metal from migrating into the gate oxide film or into the interface with the oxide film so as to improve the reliability of the product.

In embodiment 5, aluminum is used as an electrode material of the metal gate. Alternatively, it is also possible to use other metals such as titanium, zirconium, hafnium, tantalum, niobium, and vanadium as well as nitrides of these metals. In this case, formed by oxidation are titanium oxide, zirconium oxide, hafnium oxide, tantalum oxide, niobium oxide and vanadium oxide.

Embodiment 5 is applied to a MOSFET of a damascene structure. In addition, embodiment 5 can be applied to an ordinary MOSFET.

As described above, a silicide film is formed, in embodiment 5 by a damascene gate process, after formation of a gate insulating film, making it possible to prevent the metal contained in the silicide film from migrating into the gate insulating film.

Incidentally, the insulating film described previously in conjunction with embodiments 1 and 2 can also be used in embodiment 5.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a semiconductor substrate;
   a metal-containing insulating film formed directly or indirectly on said semiconductor substrate, said metal-containing insulating film including a plurality of first insulating regions each of which is formed of a grain containing a metal oxide and a second insulating region formed of an amorphous insulating material, each of said first insulating regions being formed in said second insulating region; and
   an electrode formed on said metal-containing insulating film.

2. The semiconductor device according to claim 1, wherein said first insulating region contains a crystal of said metal oxide, and said second insulating region contains silicon, oxygen and a metal forming said metal oxide.

3. The semiconductor device according to claim 1, wherein said first insulating region contains a crystal of said metal oxide, and said second insulating region contains oxygen and a second metal element differing from a first metal element forming said metal oxide.

4. The semiconductor device according to claim 1, wherein said first insulating region is formed of crystal grains of said metal oxide, and said second insulating region is formed of an amorphous region of said metal oxide.

5. The semiconductor device according to claim 1, wherein said metal-containing insulating film includes at least one surface which is covered with a covering insulating region made of the amorphous insulating material.

6. A semiconductor device, comprising:
   a first metal oxide insulating film formed directly or indirectly on a semiconductor substrate;
   a second metal oxide insulating film formed on said first metal oxide insulating film; and
   an electrode formed on said second metal oxide insulating film,
   wherein, the decrease of the Gibbs free energy at the time when a metal contained in the electrode forms an oxide is larger than that at the time when a metal contained in the first metal oxide insulating film forms an oxide, and the decrease of the Gibbs free energy at the time when a metal contained in the second metal oxide insulating film forms an oxide is larger than or equal to that at the time when the metal contained in the electrode forms an oxide.

7. The semiconductor device according to claim 6, wherein said second metal oxide insulating film is selected from the group consisting of a titanium oxide film, a zirconium oxide film, a hafnium oxide film, a tantalum oxide film and a niobium oxide film, and said electrode is selected from the group consisting of a titanium nitride film, a zirconium nitride film, a hafnium nitride film, a tantalum nitride film and a niobium nitride film.

* * * * *

UNITED STATES PATENT AND TRADEMARK OFFICE
CERTIFICATE OF CORRECTION

PATENT NO. : 6,737,716 B1 Page 1 of 1
DATED : May 18, 2004
INVENTOR(S) : Matsuo et al.

It is certified that error appears in the above-identified patent and that said Letters Patent is hereby corrected as shown below:

Title page,
Item [73], Assignee, change "Kawashi" to -- Kawasaki-shi --.

Signed and Sealed this

Twenty-third Day of November, 2004

JON W. DUDAS
*Director of the United States Patent and Trademark Office*